(12) United States Patent
Griffiths

(10) Patent No.: US 10,620,651 B1
(45) Date of Patent: Apr. 14, 2020

(54) METAL OXIDE SEMICONDUCTOR FIELD EFFECT TRANSISTOR (MOSFET) BASED VOLTAGE REGULATOR CIRCUIT

(71) Applicant: SONY CORPORATION, Tokyo (JP)

(72) Inventor: Bernard James Griffiths, Ben Lomond, CA (US)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/508,371

(22) Filed: Jul. 11, 2019

(51) Int. Cl.
G05F 1/575 (2006.01)
G05F 3/24 (2006.01)
H03F 3/45 (2006.01)
H03F 1/34 (2006.01)
G05F 3/26 (2006.01)

(52) U.S. Cl.
CPC .............. *G05F 1/575* (2013.01); *G05F 3/247* (2013.01); *G05F 3/262* (2013.01); *H03F 1/34* (2013.01); *H03F 3/45179* (2013.01)

(58) Field of Classification Search
CPC ... G05F 1/56; G05F 1/575; G05F 1/59; G05F 1/595; G05F 3/24; G05F 3/247; G05F 3/262; H03F 1/34; H03F 1/342; H03F 3/45179
See application file for complete search history.

(56) References Cited

U.S. PATENT DOCUMENTS

| 6,285,257 B1 * | 9/2001 | Abe ........................ H03F 1/342 330/277 |
| 6,940,336 B2 | 9/2005 | Bakker |
| 7,863,874 B2 * | 1/2011 | Oelmaier .................. G05F 1/56 323/273 |
| 8,497,668 B2 | 7/2013 | Ha et al. |
| 8,508,307 B2 | 8/2013 | Mitsuda et al. |
| 8,988,949 B2 | 3/2015 | Hua et al. |
| 2019/0235544 A1* | 8/2019 | Itakura .................... G05F 1/561 |

FOREIGN PATENT DOCUMENTS

JP 2008152433 * 7/2008 .............. G05F 1/56

OTHER PUBLICATIONS

Nimkar, et al., "Design of a Programmable Low Drop-Out Regulator using CMOS Technology", International Journal of Innovative Research in Computer and Communication Engineering, vol. 3, No. 2, Feb. 2015, pp. 957-963.

* cited by examiner

*Primary Examiner* — Matthew V Nguyen
(74) *Attorney, Agent, or Firm* — Chip Law Group

(57) ABSTRACT

A metal oxide semiconductor field effect transistor (MOSFET) based voltage regulator circuit includes a first resistor, a second resistor, and a first MOSFET. A first gate terminal of the first MOSFET is connected to a second terminal of the first resistor and a first terminal of the second resistor. A first drain terminal of the first MOSFET is connected to a second terminal of the second resistor and a first output terminal of the voltage regulator circuit. The first MOSFET receives an input supply voltage at the first gate terminal of the first MOSFET, via the first resistor. The first MOSFET provides a first constant output voltage at the first output terminal based on a change in the input supply voltage.

23 Claims, 16 Drawing Sheets

METAL OXIDE SEMICONDUCTOR FIELD EFFECT TRANSISTOR (MOSFET) BASED VOLTAGE REGULATOR CIRCUIT

CROSS-REFERENCE TO RELATED APPLICATIONS/INCORPORATION BY REFERENCE

None.

FIELD

Various embodiments of the disclosure relate to voltage regulation. More specifically, various embodiments of the disclosure relate to a metal oxide semiconductor field effect transistor (MOSFET) based voltage regulator circuit.

BACKGROUND

Advancements in the field of analog and digital circuits have increased the utilization of voltage regulator circuits in different applications. Typically, a voltage regulator circuit includes bipolar transistors to provide regulated output voltage. In certain situations, the bipolar transistor-based voltage regulator circuit provides lesser accuracy in the output regulation with respect to variations in an input supply voltage or a temperature.

Further limitations and disadvantages of conventional and traditional approaches will become apparent to one of skill in the art, through comparison of described systems with some aspects of the present disclosure, as set forth in the remainder of the present application and with reference to the drawings.

SUMMARY

A MOSFET-based voltage regulator circuit, is provided substantially as shown in, and/or described in connection with, at least one of the figures, as set forth more completely in the claims.

These and other features and advantages of the present disclosure may be appreciated from a review of the following detailed description of the present disclosure, along with the accompanying figures in which like reference numerals refer to like parts throughout.

DETAILED DESCRIPTION

The following described implementations may be found in the disclosed metal oxide semiconductor field effect transistor (MOSFET)-based voltage regulator circuit. Exemplary aspects of the disclosure provide a voltage regulator circuit that is based on unipolar transistor (i.e. MOSFET) which may be used in various applications that require low power consumption, less circuit complexity, and low silicon area, as compared to the typical voltage regulator circuits which may be based on bipolar transistors. The disclosed MOSFET-based voltage regulator circuit may be configured to utilize a negative feedback of the MOSFET to improve the stability of the disclosed voltage regulator circuit. The disclosed voltage regulator circuit may achieve voltage regulation over change in an input supply voltage of the voltage regulator circuit. Furthermore, the disclosed voltage regulator circuit may achieve an improved voltage regulation over change in the input supply voltage or temperature by the utilization of multiple MOSFETs. Additionally, the disclosed MOSFET-based voltage regulator circuit may further achieve voltage regulation over change in temperature around the voltage regulator circuit by inclusion of an operational amplifier circuit.

Figure 1A:
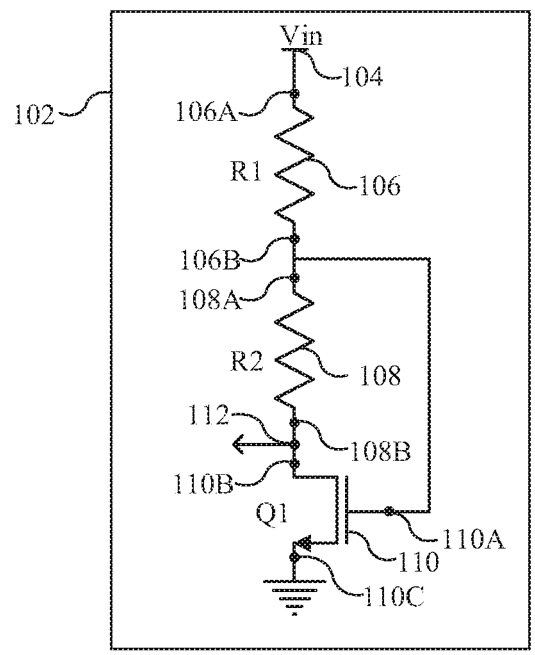
FIG. 1A is a first schematic diagram of an exemplary MOSFET-based voltage regulator circuit, in accordance with an embodiment of the disclosure.

FIG. 1A is a first schematic diagram of an exemplary MOSFET-based voltage regulator circuit, in accordance with an embodiment of the disclosure. With reference to FIG. 1A, there is shown a voltage regulator circuit 102. The voltage regulator circuit 102 may include an input terminal 104, a first resistor 106 (also represented as "R1"), a second resistor 108 (also represented as "R2"), a first MOSFET 110 (also represented as "Q1"), and a first output terminal 112. The first MOSFET 110 may be N-type MOSFET (or NMOS). The input terminal 104 of the voltage regulator circuit 102 may be connected to a first terminal 106A of the first resistor 106.

In accordance with an embodiment, a first gate terminal 110A of the first MOSFET 110 may be connected to a second terminal 106B of the first resistor 106 and a first terminal 108A of the second resistor 108. A first drain terminal 110B of the first MOSFET 110 may be connected to a second terminal 108B of the second resistor 108 and the first output terminal 112 of the voltage regulator circuit 102. A first source terminal 110C of the first MOSFET 110 may be grounded. In accordance with an embodiment, the first resistor 106 may be connected in series with the second resistor 108. In accordance with an embodiment, a ratio of a resistance value of the first resistor 106 and a resistance value of the second resistor 108 may be a defined ratio. In an embodiment, the resistance value of the first resistor 106 and the resistance value of the second resistor 108 may be based on a number of MOSFETS used in the voltage regulator circuit 102, and a channel length and width of the MOSFET (for example first MOSFET 110). For example, for a single MOSFET (such as the first MOSFET 110) in the voltage regulator circuit 102 and the channel length (L) as 10 µm and the channel width (W) as 9 µm of the single MOSFET, the resistance value of the first resistor 106 may be 3.9K ohms and the resistance value of the second resistor 108 may be 7K ohms.

The voltage regulator circuit 102 may be configured to receive an input supply voltage (also represented as "Vin") at the input terminal 104. The first MOSFET 110 may be configured to receive the input supply voltage Vin at the first gate terminal 110A of the first MOSFET 110, via the first resistor 106 (also represented as "R1"). The first MOSFET 110 may be further configured to receive the input supply voltage Vin at the first gate terminal 110A based on the defined ratio. The first MOSFET 110 may be further configured to provide a negative feedback and functions or operates as a negative feedback amplifier.

In accordance with an embodiment, the first MOSFET 110 may be further configured to provide the first constant output voltage at the first output terminal 112 based on a change in the input supply voltage Vin. In some embodiments, the voltage regulator circuit 102 may be configured to output the first constant output voltage at the first output terminal 112 based on the defined ratio of the resistance values of the first resistor 106 and the second resistor 108.

For example, as the input supply voltage Vin at the input terminal 104 of the voltage regulator circuit 102 increases, a current flow between the input terminal 104 and the first gate terminal 110A through the first resistor 106 may also increase. This may further increase an input voltage received at the first gate terminal 110A of the first MOSFET 110, where the increase in the input supply voltage may be based on increase of the input supply voltage Vin and the defined ratio of the first resistor 106 and the second resistor 108.

In accordance with an embodiment, an increase in the input supply voltage at the first gate terminal 110A over a defined gate threshold voltage, may turn-on the first MOSFET 110 in a pull-down configuration and may output a constant voltage at the drain terminal 110B of the first MOSFET 110. Thus, the voltage regulator circuit 102 may provide the first constant output voltage at the first output terminal 112. The output voltage at the drain terminal 110B or the first output terminal 112 may remain constant even though the input supply voltage Vin at the input terminal 104 changes (increase or decrease in a particular voltage range once the first MOSFET 110 is turned-on. In some embodiments, the first constant output voltage may be a desired voltage required from the voltage regulator circuit 102. Thus, the first MOSFET 110 may be utilized to achieve voltage regulation due to the first constant output voltage provided by the voltage regulator circuit 102 over a change in the input supply voltage Vin.

In some embodiments, a second MOSFET circuit may be cascaded with the voltage regulator circuit 102, to provide a second constant output voltage. The second MOSFET circuit cascaded with the voltage regulator circuit 102 may be utilized to achieve additional voltage regulation. The second MOSFET circuit cascaded with the voltage regulator circuit 102 is further described in detail, for example, in FIG. 2A. In some other embodiments, a plurality of MOSFET circuits may be cascaded with the voltage regulator circuit 102 to achieve additional voltage regulation.

In accordance with an embodiment, the voltage regulator circuit 102 may be connected with an operational amplifier, to achieve a constant output voltage in response to a change in temperature around the voltage regulator circuit 102. The voltage regulator circuit 102 connected with the operational amplifier is further described in detail, for example, in FIG. 3. In some other embodiments, the voltage regulator circuit 102 may include P-type MOSFET instead of the N-type MOSFET (such as the first MOSFET 110). The voltage regulator circuit 102 that includes the P-type MOSFET is further described in detail in FIGS. 9A, 9B, 9C, and 9D.

Figure 1B:
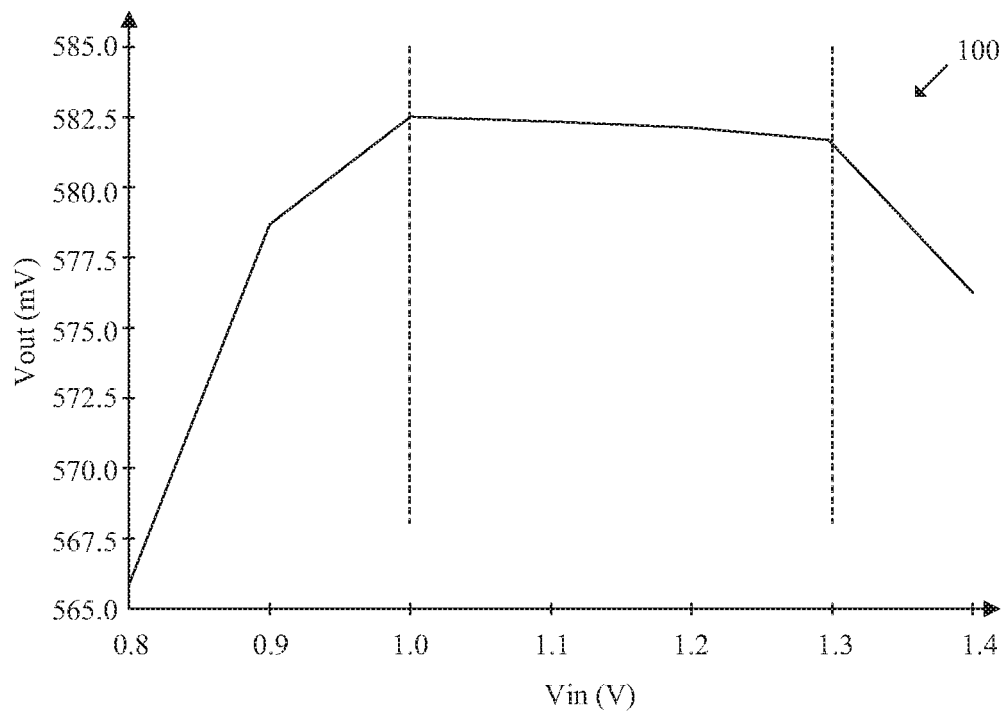
FIG. 1B is a graph that illustrates changes in an output voltage based on changes in an input supply voltage of the MOSFET-based voltage regulator circuit of FIG. 1A, in accordance with an embodiment of the disclosure.

FIG. 1B is a graph that illustrates changes in an output voltage based on changes in an input supply voltage of the MOSFET-based voltage regulator circuit of FIG. 1A, in accordance with an embodiment of the disclosure. FIG. 1B is explained in conjunction with elements from FIG. 1A. With reference to FIG. 1B, there is shown a first graph 100. The first graph 100 indicates an input supply voltage (also represented as Vin in volts at X-axis) and an output voltage (in mV at Y-axis) of the voltage regulator circuit 102. The input supply voltage Vin and the output voltage values depicted at FIG. 1A, may be an exemplary experimental or simulation data determined from the voltage regulator circuit 102 and may not be construed as limiting the present disclosure.

From the first graph 100, it may be observed that when the input supply voltage Vin (supplied at the input terminal 104) increases from 0.8 V to 1.0 V, the output voltage (output at the first output terminal 112) of the voltage regulator circuit 102 increases from 566 mV to 582.5 mV. Furthermore, it may be observed, that as the input supply voltage Vin increases from the 1.0 V to 1.3 V, the voltage regulator circuit 102 may provide an almost constant output voltage as the output voltage at the first output terminal 112 of the voltage regulator circuit 102. In other words, for a change of 300 mV in the input supply voltage Vin, the change in the output voltage is approximately less than 1.0 mV. Hence, the voltage regulator circuit 102 may provide the constant output voltage (i.e. first constant output voltage) at the first output terminal 112 based on the change in the input supply voltage Vin for a particular voltage range between 1.0 V to 1.3 V, as shown in the first graph 100.

Figure 2A:
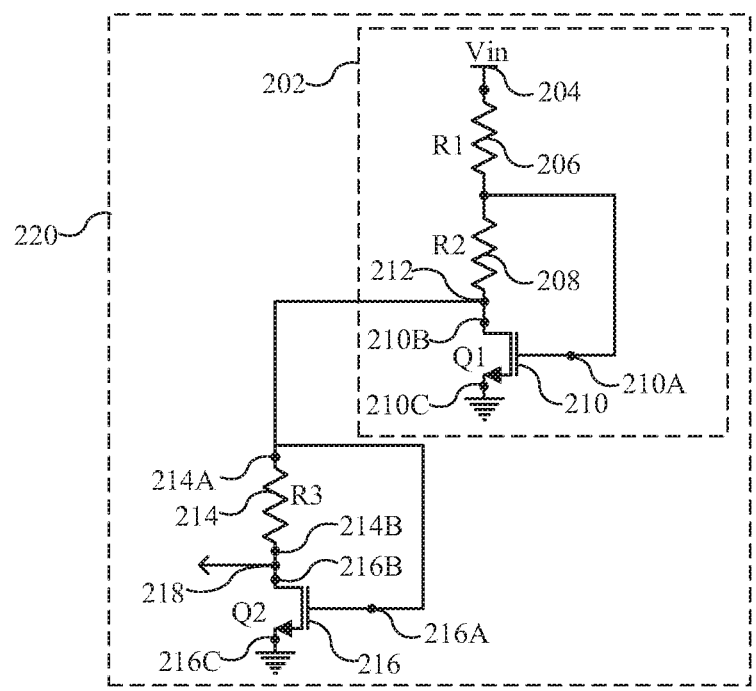
FIG. 2A is a schematic diagram of an exemplary MOSFET-based voltage regulator circuit, in accordance with an embodiment of the disclosure.

FIG. 2A is a schematic diagram of an exemplary MOSFET-based voltage regulator circuit, in accordance with an embodiment of the disclosure. FIG. 2A is explained in conjunction with elements from FIG. 1A and FIG. 1B. With reference to FIG. 2A, there is shown a first voltage regulator circuit 202 which may be similar to the voltage regulator circuit 102 of FIG. 1. The first voltage regulator circuit 202 may include the input terminal 204, a first resistor 206 (also represented as "R1"), a second resistor 208 (also represented as "R2"), a first MOSFET 210 (also represented as "Q1"), and a first output terminal 212. The connections and the functionalities of the first resistor 206, the second resistor 208, and the first MOSFET 210 may be similar to the first resistor 106, the second resistor 108, and the first MOSFET 110 of FIG. 1A.

With reference to FIG. 2A, there is further shown a third resistor 214 (also represented as "R3"), a second MOSFET 216 (also represented as "Q2"), a second output terminal 218, and a second voltage regulator circuit 220. The second voltage regulator circuit 220 may include the first voltage regulator circuit 202, the third resistor 214, the second MOSFET 216, and the second output terminal 218. The second voltage regulator circuit 220 may be a MOSFET-based voltage regulator circuit (as described in FIG. 1A) that includes two MOSFETs. In accordance with an embodiment, the second MOSFET 216 may be N-type MOSFET. The second MOSFET 216 may be cascaded with the first voltage regulator circuit 202.

A second gate terminal 216A of the second MOSFET 216 may be connected to the first output terminal 212 of the first MOSFET 210 and a first terminal 214A of the third resistor 214. The first output terminal 212 of the first MOSFET 210 may be an output terminal of the first voltage regulator circuit 202. A second drain terminal 216B of the second MOSFET 216 may be connected to a second terminal 214B of the third resistor 214 and the second output terminal 218 of the second voltage regulator circuit 220. A first source terminal 210C of the first MOSFET 210 and a second source terminal 216C of the second MOSFET 216 may be grounded as shown in FIG. 2A.

In accordance with an embodiment, the first MOSFET 210 may be configured to receive the input supply voltage Vin at the first gate terminal 210A of the first MOSFET 210, via the first resistor 206. The first MOSFET 210 may be further configured to provide a first constant output voltage at the first output terminal 212 based on a change in the input supply voltage Vin, as described in FIG. 1A. The second MOSFET 216 may be configured to receive the first constant output voltage at the second gate terminal 216A of the second MOSFET 216. The second MOSFET 216 may be further configured to provide a negative feedback and functions or operates as a negative feedback amplifier. The negative feedback provided by the second MOSFET 216 may improve stability of the output at the second output terminal 218 of the second voltage regulator circuit 220. The second MOSFET 216 may be further configured provide a second constant output voltage at the second output terminal 218 based on the change in the input supply voltage Vin. For example, based on increase in the input supply voltage Vin at the input terminal 204, the first voltage regulator circuit 202 may provide the first constant output voltage at the first output terminal 212 and the third resistor 214. The first constant output voltage may be received at the second gate terminal 216A of the second MOSFET 216. In case, the first constant output voltage received at the second gate terminal 216A increases beyond a threshold gate voltage of the second MOSFET 216, the second MOSFET 216 may be turned-on and operate in the pull-down configuration. At the turn-on state, a voltage drop at the second drain terminal 216B of the second MOSFET 216 and the second output terminal 218 may be substantially constant.

The second voltage regulator circuit 220 may be configured to provide the second constant output voltage at the second output terminal 218 even though there is a change (i.e. increase or decrease) in the input supply voltage Vin at the input terminal 204 once the second MOSFET 216 may be turned-on. The change in the output voltage at the second output terminal 218 may be minimum as compared to change in the input supply voltage Vin once the second MOSFET 216 may be in a turned-on state. In accordance with an embodiment, a resistance value of a third resistance of the third resistor 214 may be defined such that the second gate terminal 216A may receive appropriate voltage from the first output terminal 212 to turn on the second MOSFET 216. The second MOSFET 216 cascaded with the first voltage regulator circuit 202 may be utilized to achieve additional voltage regulation by output of the second constant output voltage at the second output terminal 218 over the first constant output voltage at the first output terminal 212.

Figure 2B:
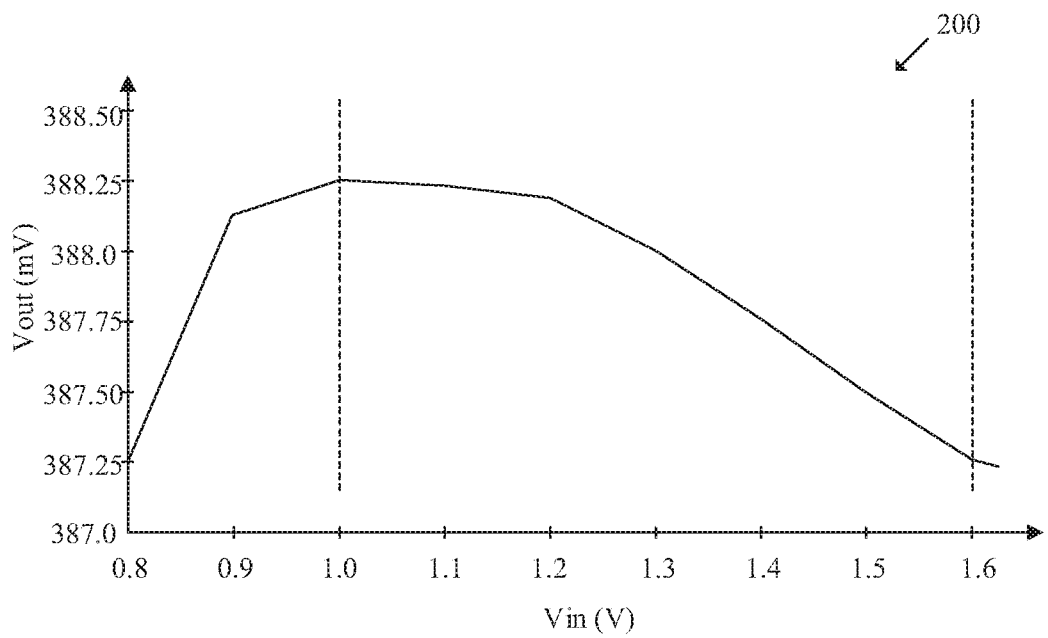
FIG. 2B is a graph that illustrates changes in an output voltage based on changes in an input supply voltage of the MOSFET-based voltage regulator circuit of FIG. 2A, in accordance with an embodiment of the disclosure.

FIG. 2B is a graph that illustrates changes in an output voltage based on changes in an input supply voltage of the MOSFET-based voltage regulator circuit of FIG. 2A, in accordance with an embodiment of the disclosure. FIG. 2B is explained in conjunction with elements from FIG. 2A. With reference to FIG. 2B, there is shown a second graph 200. The second graph 200 indicates an input supply voltage (also represented as Vin in volts at X-axis) and an output voltage (in mV at Y-axis) of the second voltage regulator circuit 220. The output voltage may be output at the second output terminal 218. The input supply voltage Vin and the output voltage values depicted at FIG. 2A, may be an exemplary experimental or simulation data determined from the second voltage regulator circuit 220 and may not be construed as limiting the present disclosure.

From the second graph 200, it may be observed that when the input supply voltage Vin (i.e. supplied at the input terminal 104) increases from 0.8 V to 1.0 V, the output voltage (i.e. output at the second output terminal 218) of the second voltage regulator circuit 220 increases from 387.25 mV to 388.25 mV (for example). Furthermore, it may be observed, that as the input supply voltage Vin increases from the 1.0 V to 1.6 V, the second voltage regulator circuit 220 may provide an almost constant output voltage as the output voltage at the second output terminal 218. In other words, for a change of 600 mV (i.e. 1.0 V to 1.6 V) in the input supply voltage Vin, the change in the output voltage lies between 388.25 mV to 387.25 mV. In other words, for a change of 600 mV in the input supply voltage Vin, the change in the output voltage may be 1.0 mV. Hence, the second voltage regulator circuit 220 may provide twice or double voltage regulation (i.e. 1.0 mV change in output at a range of 600 mV change in input) as compared to the first voltage regulator circuit 202 or the voltage regulator circuit 102 (i.e. which provides 1.0 mV change in output at a range of 300 mV change in input).

Figure 2C:
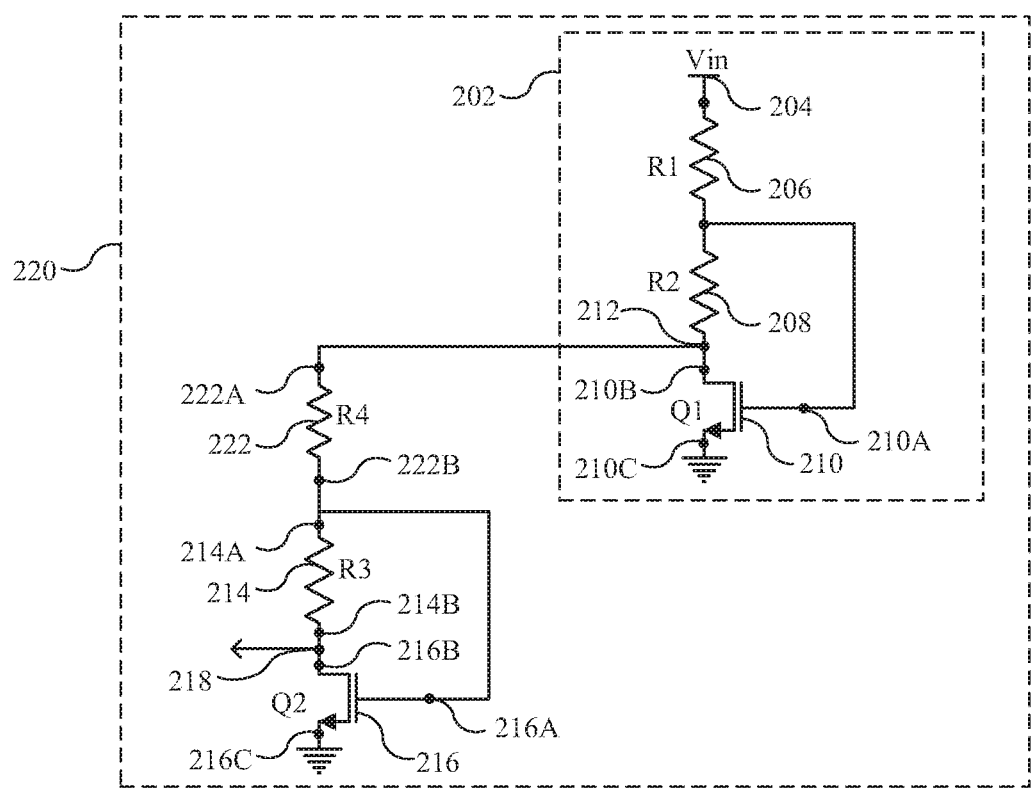
FIG. 2C is a schematic diagram of a MOSFET-based voltage regulator circuit of FIG. 2A, in accordance with an embodiment of the disclosure.

FIG. 2C is a schematic diagram of a MOSFET-based voltage regulator circuit of FIG. 2A, in accordance with an embodiment of the disclosure. With reference to FIG. 2C, there is shown the second voltage regulator circuit 220, as described in FIG. 2A. The second voltage regulator circuit 220 may further include a fourth resistor 222 (also represented as "R4"). The fourth resistor 222 may be connected in series with the third resistor 214. The first output terminal 212 may be connected with a first terminal 222A of the fourth resistor 222. The second gate terminal 216A of the second MOSFET 216 may be connected to a second terminal 222B of the fourth resistor 222 and the first terminal 214A of the third resistor 214.

The second MOSFET 216 may be configured to receive the first constant output voltage at the second gate terminal 216A of the second MOSFET 216, via the fourth resistor 222. A resistance value of the fourth resistor 222 may be defined such that the second gate terminal 216A may receive appropriate voltage from the first output terminal 212 to turn on the second MOSFET 216. In accordance with an embodiment, the operations of the second voltage regulator circuit 220, which includes the fourth resistor 222 in FIG. 2C may be same as the first voltage regulator circuit 202, as described in FIG. 2A. and may not affect the scope of operations of the second voltage regulator circuit 220.

Figure 3:
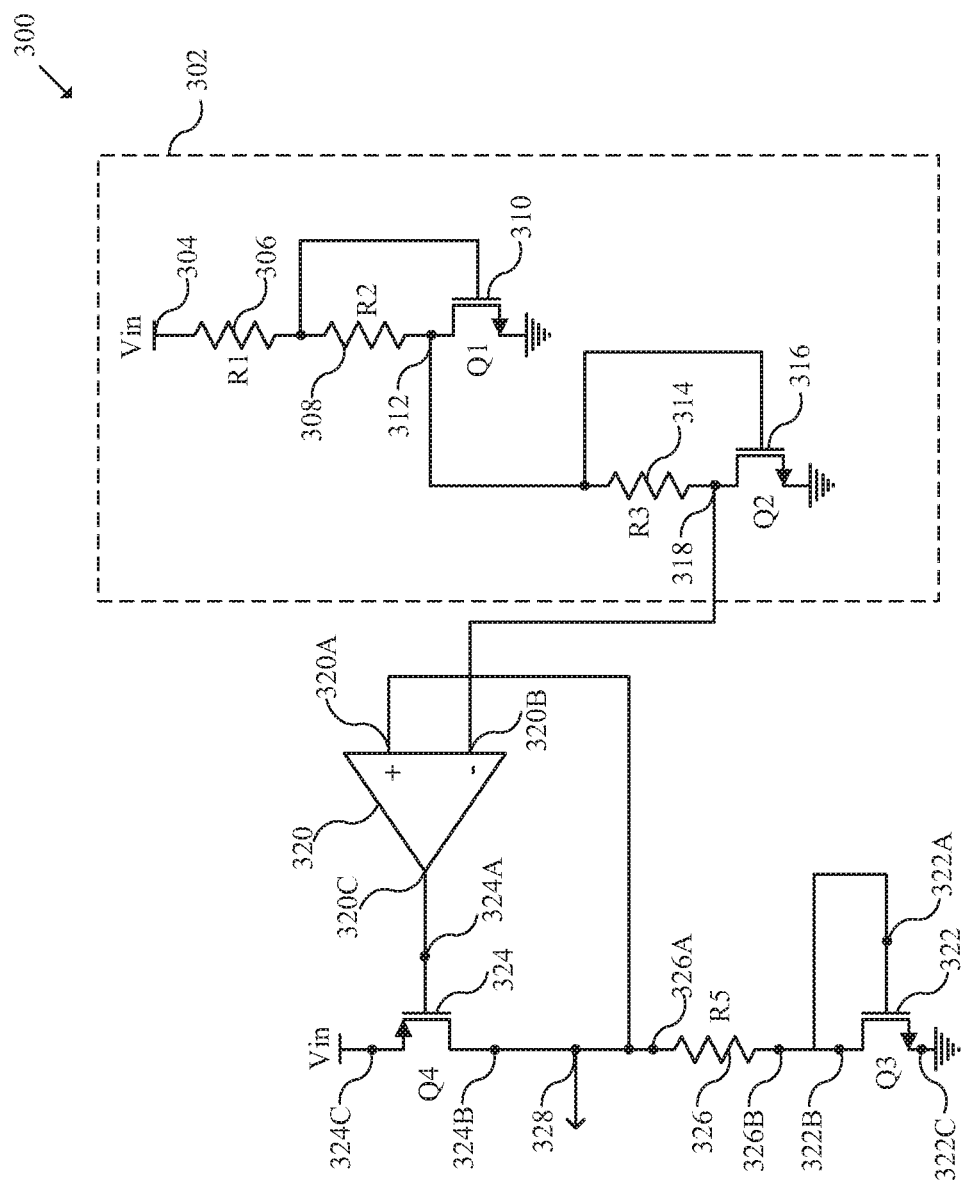
FIG. 3 is a schematic diagram of an exemplary MOSFET-based voltage regulator circuit of FIG. 2A connected with an operational amplifier, in accordance with an embodiment of the disclosure.

FIG. 3 is a schematic diagram of an exemplary MOSFET-based voltage regulator circuit of FIG. 2A connected with an operational amplifier, in accordance with an embodiment of the disclosure. FIG. 3 is described in conjunction with elements from FIGS. 1A and 2A. With reference to FIG. 3, there is shown a voltage regulator circuit 302. The voltage regulator circuit 302 may correspond to the second voltage regulator circuit 220 of FIG. 2A. The voltage regulator circuit 302 may include an input terminal 304, a first resistor 306 (also represented as "R1"), a second resistor 308 (also represented as "R2"), a first MOSFET 310 (also represented as "Q1"), a first output terminal 312, a third resistor 314 (also represented as "R3"), a second MOSFET 316 (also represented as "Q2"), and a second output terminal 318. The connections and the functionalities of the first resistor 306, the second resistor 308, the first MOSFET 310, the third resistor 314, and the second MOSFET 316 may be similar to the first resistor 206, the second resistor 208, and the first MOSFET 210, the third resistor 214, and the second MOSFET 216 of FIG. 2A, respectively.

With reference to FIG. 3, there is further shown, an operational amplifier 320, a positive input terminal 320A of the operational amplifier 320, a negative input terminal 320B of the operational amplifier 320, and an output terminal 320C of the operational amplifier 320. There is further shown, a third MOSFET 322 (also represented as "Q3"), a fourth MOSFET 324 (also represented as "Q4"), a fifth resistor 326 (also represented as "R5"), and a third output terminal 328. The voltage regulator circuit 302 may be connected with the operational amplifier 320. The combination of the voltage regulator circuit 302 and the operational amplifier 320 is referred as a voltage reference generation circuit or a third voltage regulator circuit 300. The third output terminal 328 may be an output terminal of the voltage reference generation circuit.

In accordance with an embodiment, the voltage regulator circuit 302 may be configured to receive the input supply voltage Vin at the input terminal 304. The negative input terminal 320B of the operational amplifier 320 may be connected to the second output terminal 318 of the voltage regulator circuit 302. The positive input terminal 320A of the operational amplifier 320 may be connected to the third output terminal 328 of the voltage reference generation circuit, a fourth drain terminal 324B of the fourth MOSFET 324 and a first terminal 326A of the fifth resistor 326. The output terminal 320C of the operational amplifier 320 may be connected to a fourth gate terminal 324A of the fourth MOSFET 324.

In accordance with an embodiment, the third MOSFET 322 may be N-type MOSFET and the fourth MOSFET 324 may be P-type MOSFET. The fourth MOSFET 324 may be configured to receive the input supply voltage Vin at a fourth source terminal 324C of the fourth MOSFET 324. In accordance with an embodiment, the fourth MOSFET 324 may act as a current mirror circuit of the voltage reference generation circuit. In accordance with an embodiment, a third gate terminal 322A of the third MOSFET 322 may be connected to a second terminal 326B of the fifth resistor 326 and a third drain terminal 322B of the third MOSFET 322. The third MOSFET 322 may be configured to provide a negative feedback and functions or operates as a negative feedback amplifier. As shown in FIG. 3, a third source terminal 322C of the third MOSFET 322 may be grounded.

The operational amplifier 320 may be configured to compare the second constant output voltage received at the second output terminal 318 and a voltage reference at the third output terminal 328 of the voltage reference generation circuit (or the third voltage regulator circuit 300). The operational amplifier 320 may be further configured to control generation of the voltage reference at the third output terminal 328 based on the comparison. The generated voltage reference may be constant based on the change in the input supply voltage Vin. For example, the operational amplifier 320 may be configured to control the generation of the voltage reference, such that even when the input supply voltage Vin changes over a particular range, the generated voltage reference at the third output terminal 328 may be substantially constant. The voltage reference obtained at the third output terminal 328 may be a desired voltage that may be required from the voltage reference generation circuit which is the combination of the voltage regulator circuit 302 and the operational amplifier 320.

In accordance with an embodiment, the generated voltage reference may be constant further based on a change in temperature around the voltage reference generation circuit (or the third voltage regulator circuit 300). The voltage reference generation circuit may utilize the operational amplifier 320 and the fourth MOSFET 324 (i.e. the current mirror circuit), to generate the constant voltage reference at the third output terminal 328 over the change in the temperature. For example, even if the temperature around the voltage reference generation circuit changes, the operational amplifier 320 may control the generation of the constant voltage reference at the third output terminal 328. In some embodiments, the operational amplifier 320 may be configured to provide a negative feedback to generate the constant voltage reference at the third output terminal 328 with better regulation as compared to the second constant output voltage at the second output terminal 318 and the first constant output voltage at the first output terminal 312.

In some embodiments, the third voltage regulator circuit 300 or the voltage reference generation circuit may include only one MOSFET-based voltage regulator circuit (for example the voltage regulator circuit 102 as described in FIG. 1A), the operational amplifier 320, the third MOSFET 322, the fourth MOSFET 324, and the fifth resistor 326, without the utilization of the second MOSFET 316 and the third resistor 314. In such case, the first output terminal 312 of the voltage regulator circuit 302 may be directly connected to the negative input terminal 320B of the operational amplifier 320. In some other embodiments, a plurality of MOSFETs may be cascaded with the second output terminal 318 of the voltage regulator circuit 302.

Figure 4A:
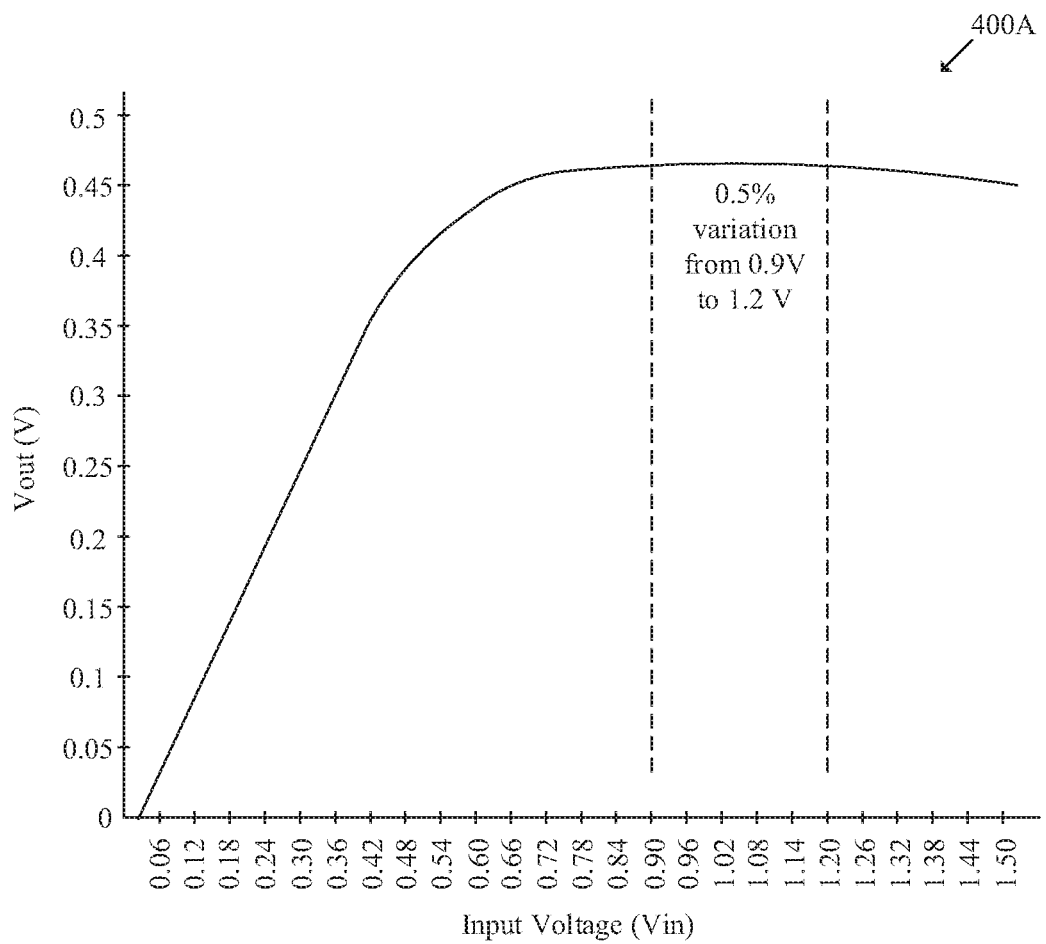
FIG. 4A is a graph that illustrates changes in an output voltage based on changes in an input supply voltage of the MOSFET-based voltage regulator circuit of FIG. 3, in accordance with an embodiment of the disclosure.

FIG. 4A is a graph that illustrates changes in an output voltage based on changes in an input supply voltage of the MOSFET-based voltage regulator circuit of FIG. 3, in accordance with an embodiment of the disclosure. FIG. 4A is explained in conjunction with elements from FIG. 3. With reference to FIG. 4A, there is shown a third graph 400A. The third graph 400A indicates an input supply voltage (also represented as Vin in volts at X-axis) and an output voltage (also represented as Vout in Volts at Y-axis) of the third voltage regulator circuit 300. The output voltage may be output at the third output terminal 328. The input supply voltage Vin and the output voltage values depicted at FIG. 4A may be an exemplary experimental or simulation data determined from the third voltage regulator circuit 300 and may not be construed as limiting the present disclosure.

From the third graph 400A, it may be observed that when the input supply voltage Vin (i.e. supplied at the input terminal 304) increases from 0.06 V to 0.90 V, the output voltage (i.e. output at the third output terminal 328) of the third voltage regulator circuit 300 increases from 0 V to 0.45 V. Furthermore, it may be observed, that as the input supply voltage Vin increases from 0.90 V to 1.20 V, the third voltage regulator circuit 300 may provide an almost constant output voltage (for example 0.45 V) as the output voltage at the third output terminal 328. As shown in FIG. 4A, there may be a 0.5% variation in the output voltage in response to a change in the input supply voltage from 0.90 V to 1.20 V. Thus, the third voltage regulator circuit 300 may provide better voltage regulation as compared to the voltage regulator circuits depicted in FIG. 1A and FIG. 2A.

Figure 4B:
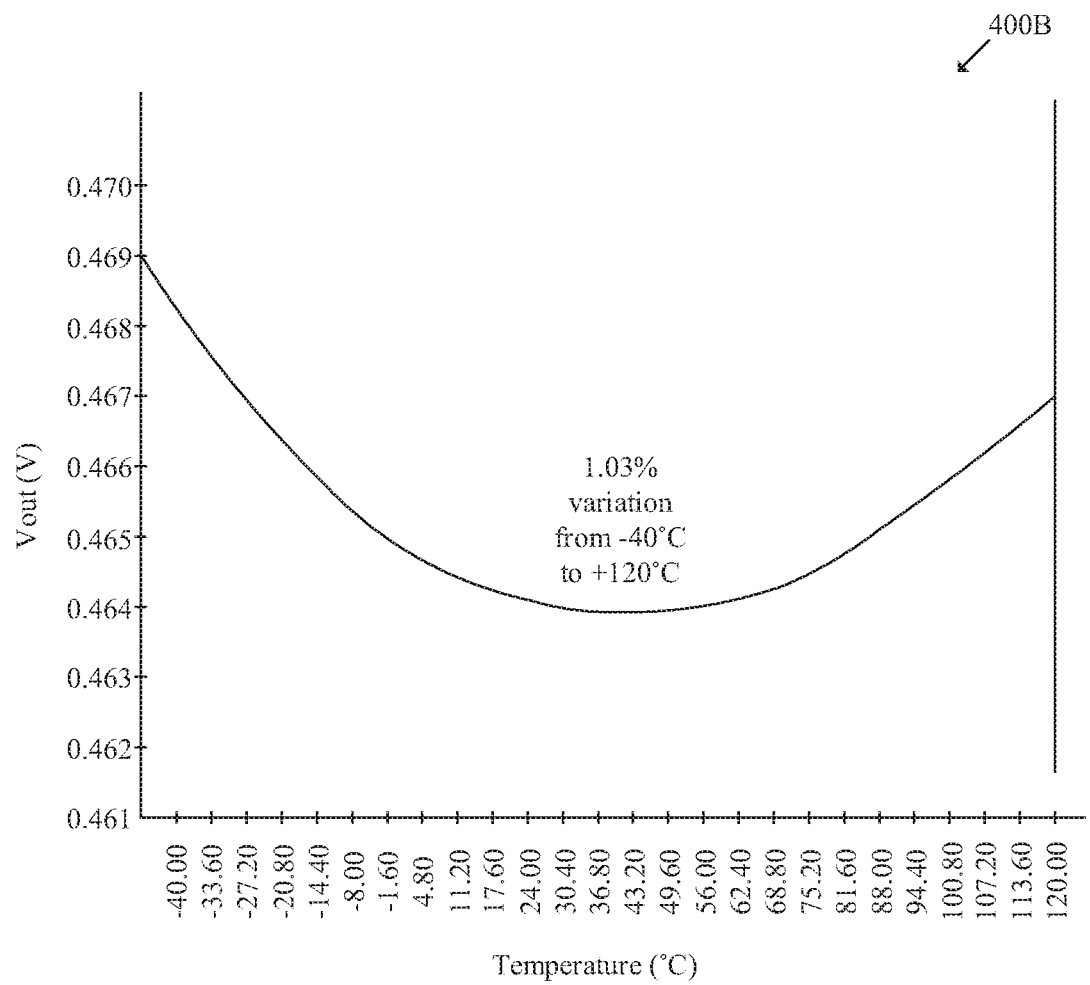
FIG. 4B is a graph that illustrates changes in output voltage based on changes in temperature around the MOSFET-based voltage regulator circuit of FIG. 3, in accordance with an embodiment of the disclosure.

FIG. 4B is a graph that illustrates changes in output voltage based on changes in temperature around the MOSFET-based voltage regulator circuit of FIG. 3, in accordance with an embodiment of the disclosure. FIG. 4B is explained in conjunction with elements from FIG. 3 and FIG. 4A. With reference to FIG. 4B, there is shown a fourth graph 400B. The fourth graph 400B indicates a temperature (in degree Celsius at X-axis) and an output voltage (also represented as Vout in volts at Y-axis) of the third voltage regulator circuit 300. The temperature and the output voltage values depicted at FIG. 4B may be an exemplary experimental or simulation data determined from the third voltage regulator circuit 300 and may not be construed as limiting the present disclosure.

From the fourth graph 400B, it may be observed that when the temperature increases from −40 degrees Celsius to 120 degrees Celsius, the output voltage (i.e. output at the third output terminal 328) of the third voltage regulator circuit 300 decreases from 0.469 V to 0.464 V and then increases from 0.464 V to 0.467 V. In other words, it may be observed from FIG. 4A that there may be a 1.03% variation in the output voltage based on the change in the temperature from −40 degrees Celsius to 120 degrees Celsius. Thus, the third voltage regulator circuit 300 may be configured to output an almost constant output voltage based on the change in the temperature around the third voltage regulator circuit 300, as shown in the fourth graph 400B in FIG. 4B.

Figure 5:
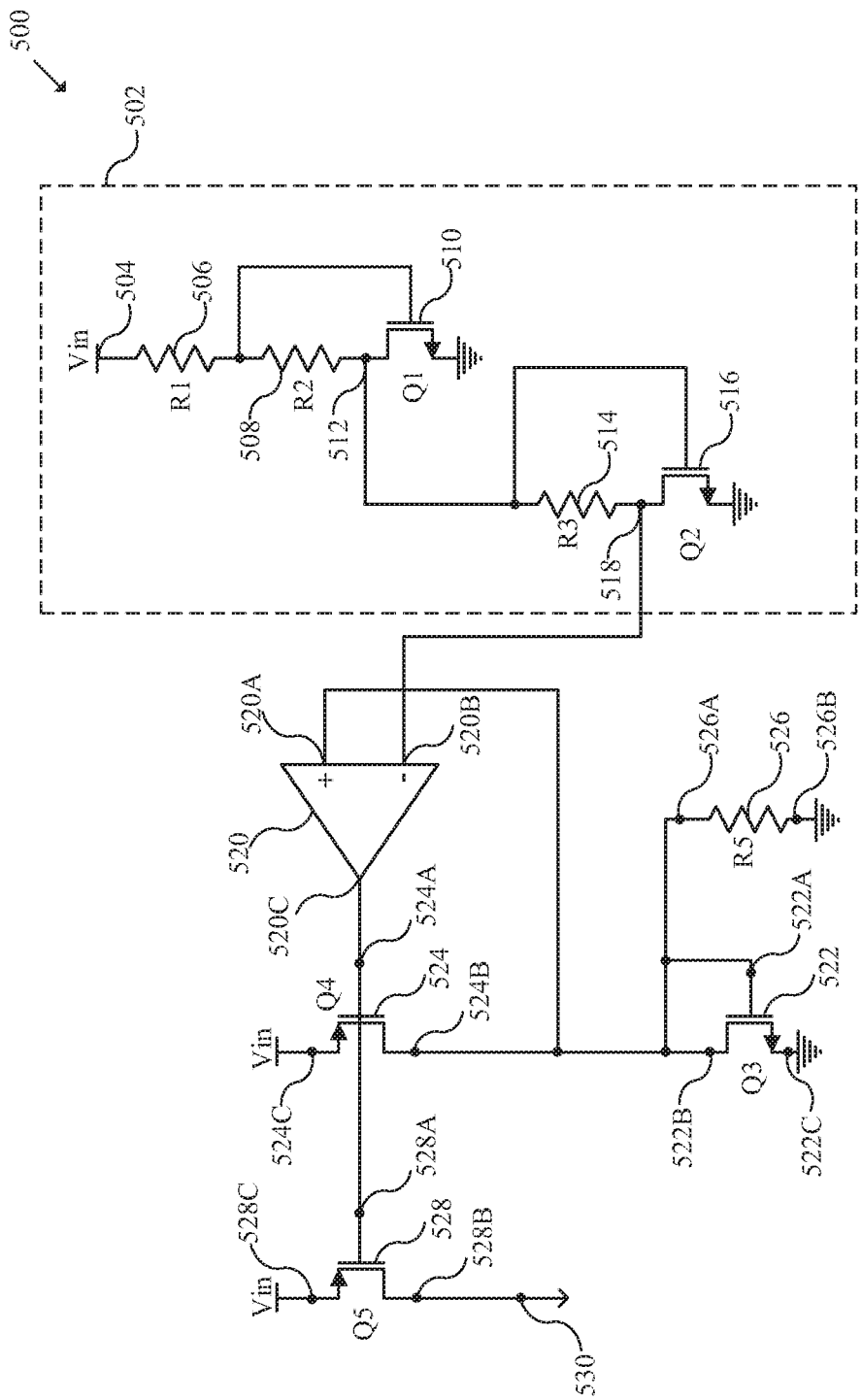
FIG. 5 is a schematic diagram of an exemplary MOSFET-based voltage regulator circuit of FIG. 2A connected with an operational amplifier to provide constant output current based on changes in an input supply voltage and changes in temperature, in accordance with an embodiment of the disclosure.

FIG. 5 is a schematic diagram of an exemplary MOSFET-based voltage regulator circuit of FIG. 2A connected with an operational amplifier to provide constant output current based on changes in an input supply voltage and changes in temperature, in accordance with an embodiment of the disclosure. FIG. 5 is described in conjunction with elements from FIGS. 1A, 2A, and 3. With reference to FIG. 5, there is shown a fourth voltage regulator circuit 500 which includes the second voltage regulator circuit 502 may correspond to the voltage regulator circuit 302 of FIG. 3 or the second voltage regulator circuit 220 of FIG. 2A. The second voltage regulator circuit 502 may include an input terminal 504, a first resistor 506 (also represented as "R1"), a second resistor 508 (also represented as "R2"), a first MOSFET 510 (also represented as "Q1"), a first output terminal 512, a third resistor 514 (also represented as "R3"), a second MOSFET 516 (also represented as "Q2"), and a second output terminal 518. The connections and the functionalities of the first resistor 506, the second resistor 508, the first MOSFET 510, the third resistor 514, and the second MOSFET 516 may be similar to the first resistor 206, the second resistor 208, the first MOSFET 210, the third resistor 214, and the second MOSFET 216 of FIG. 2A, respectively.

With reference to FIG. 5, there is further shown, an operational amplifier 520, a third MOSFET 522 (also represented as "Q3"), a fourth MOSFET 524 (also represented as "Q4"), a fifth resistor 526 (also represented as "R5"), a fifth MOSFET 528 (also represented as "Q5"), and a fourth output terminal 530. The connections and functionalities of the operational amplifier 520, the third MOSFET 522, and the fourth MOSFET 524 may be similar to the operational amplifier 320, the third MOSFET 322, and the fourth MOSFET 324 of FIG. 3A, respectively. The second voltage regulator circuit 502 may be connected with the operational amplifier 520. The fourth output terminal 530 may be an output terminal of the fourth voltage regulator circuit 500.

As shown in FIG. 5, a negative input terminal 520B of the operational amplifier 520 may be connected to the second output terminal 518 of the second voltage regulator circuit 502. The positive input terminal 520A of the operational amplifier 520 may be connected to a fourth drain terminal 524B of the fourth MOSFET 524 and a third drain terminal 522B of the third MOSFET 522. The output terminal 520C of the operational amplifier 520 may be connected to a fourth gate terminal 524A of the fourth MOSFET 524 and a fifth gate terminal 528A of the fifth MOSFET 528. The fourth output terminal 530 of the fourth voltage regulator circuit 500 may be connected to a fifth drain terminal 528B of the fifth MOSFET 528 as shown in FIG. 5.

In accordance with an embodiment, the third MOSFET 522 may be N-type MOSFET. The fourth MOSFET 524 and the fifth MOSFET 528 may be P-type MOSFETs. The fourth MOSFET 524 may be configured to receive the input supply voltage Vin at a fourth source terminal 524C of the fourth MOSFET 524. Similarly, the fifth MOSFET 528 may be configured to receive the input supply voltage Vin at a fifth source terminal 528C of the fifth MOSFET 528. The fourth MOSFET 524 may function or operate as a current mirror circuit of the fourth voltage regulator circuit 500 and the third MOSFET 522 may be connected in parallel with the fifth resistor 526. As shown in FIG. 5, a third gate terminal 522A of the third MOSFET 522 may be connected with a first terminal 526A of the fifth resistor 526. A second terminal 526B of the fifth resistor 526 and a source terminal 522C of the third MOSFET 522 may be grounded.

In accordance with an embodiment, the parallel connection of the third MOSFET 522 and the fifth resistor 526 may be configured to provide a constant output current based on the change in the input supply voltage Vin. In some embodiments, the parallel connection of the third MOSFET 522 and the fifth resistor 526 may be further configured to provide the constant output current based on the change in temperature around the fourth voltage regulator circuit 500. The constant output current may be provided at the fourth output terminal 530. Thus, based on the parallel connection of the third MOSFET 522 and the fifth resistor 526; and fourth MOSFET 524 (the current mirror circuit), the fourth voltage regulator circuit 500 may provide the constant output current at the fourth output terminal 530 irrespective of the change in the input supply voltage Vin and the temperature as depicted in FIGS. 6A-6B.

Figure 6A:
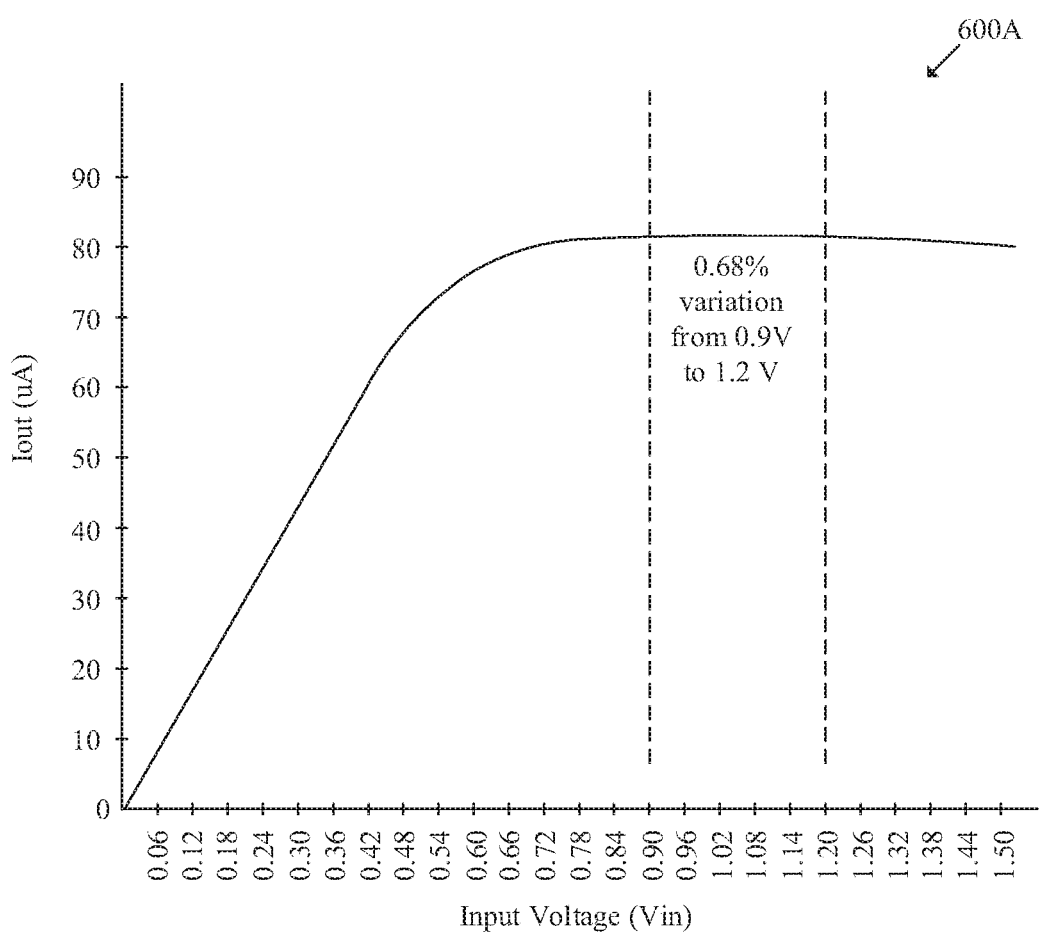
FIG. 6A is a graph that illustrates changes in an output current based on changes in an input supply voltage of the MOSFET-based voltage regulator circuit of FIG. 5, in accordance with an embodiment of the disclosure.

FIG. 6A is a graph that illustrates changes in an output current based on changes in an input supply voltage of the MOSFET-based voltage regulator circuit of FIG. 5, in accordance with an embodiment of the disclosure. FIG. 6A is explained in conjunction with elements from FIG. 5. With reference to FIG. 6A, there is shown a fifth graph 600A. The fifth graph 600A indicates an input supply voltage (also represented as Vin in volts at X-axis) and an output current (also represented as Iout in uA at Y-axis) of the fourth voltage regulator circuit 500. The input supply voltage Vin and the output current values depicted at FIG. 6A may be an exemplary experimental or simulation data determined from the fourth voltage regulator circuit 500 and may not be construed as limiting the present disclosure.

From the fifth graph 600A, it may be observed that when the input supply voltage Vin increases from 0.06 V to 0.90 V, the output current (i.e. output at the fourth output terminal 530) of the fourth voltage regulator circuit increases from 0 uA to 80 uA. Furthermore, it may be observed, that as the input supply voltage Vin increases from 0.90 V to 1.20 V, the fourth voltage regulator circuit 500 may provide an almost constant output current which is around 80 uA as example. As shown in FIG. 6A, there may be a 0.68% variation in the output current based on a change in the input supply voltage Vin from 0.90 V to 1.20 V. Thus, the fourth voltage regulator circuit 500 may be configured to output a substantial constant output current in response to the change in the input supply voltage Vin, as shown in the fifth graph 600A.

Figure 6B:
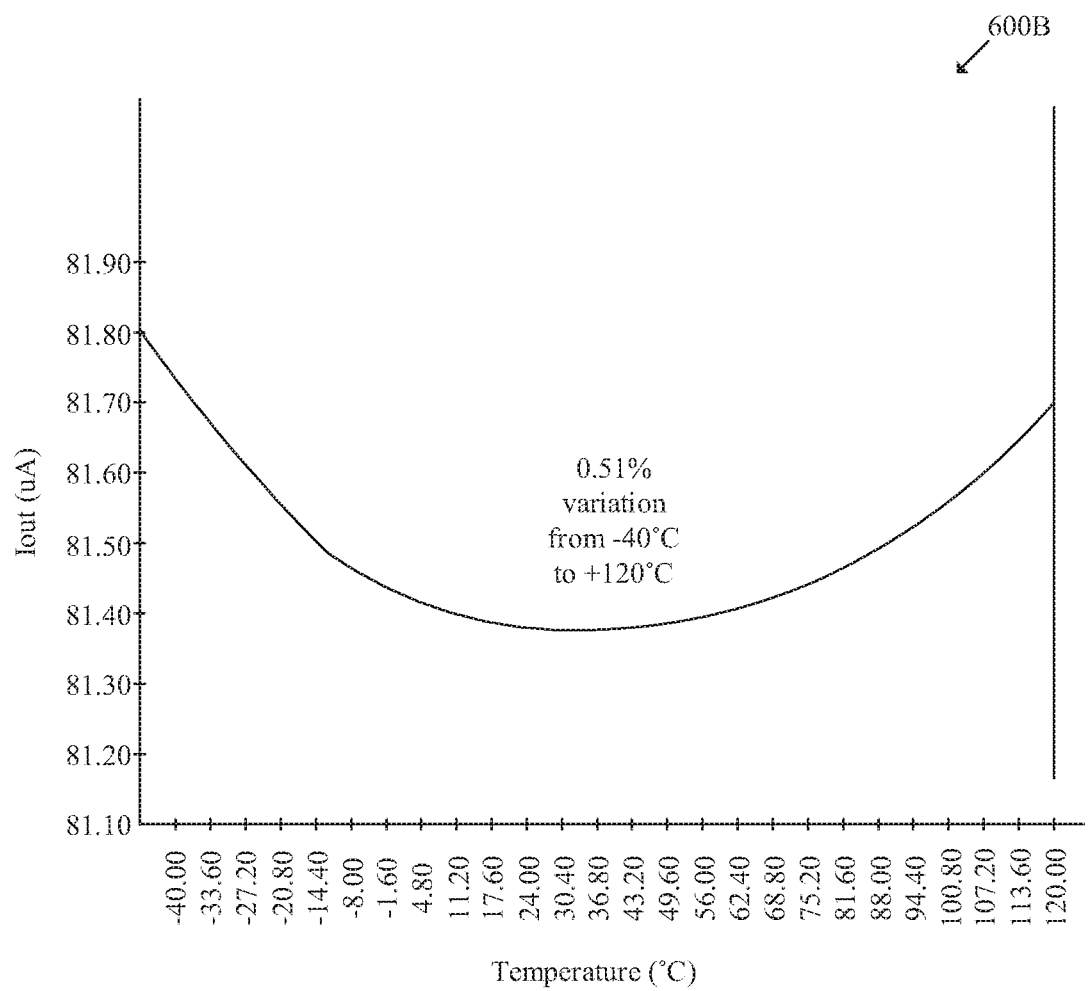
FIG. 6B is a graph that illustrates changes in an output current based on changes in temperature of the MOSFET-based voltage regulator circuit of FIG. 5, in accordance with an embodiment of the disclosure.

FIG. 6B is a graph that illustrates changes in an output current based on changes in temperature of the MOSFET-based voltage regulator circuit of FIG. 5, in accordance with an embodiment of the disclosure. FIG. 6B is explained in conjunction with elements from FIG. 5. With reference to FIG. 6B, there is shown a sixth graph 600B. The sixth graph 600B indicates a temperature (in degree Celsius at X-axis) and an output current (also represented as Iout in uA at Y-axis) of the fourth voltage regulator circuit 500. The temperature and the output current values depicted at FIG. 6B may be an exemplary experimental or simulation data determined from the fourth voltage regulator circuit 500 and may not be construed as limiting the present disclosure.

From the sixth graph 600B, it may be observed that as the temperature increases from −40 degrees Celsius to 120 degrees Celsius, the output current (i.e. output at the fourth output terminal 530) first decreases from 81.80 uA to 81.37 uA and then increases from 81.37 uA to 81.70 uA. In other words, it may be observed from FIG. 6B that there may be a 0.51% variation in the output current based on the change in the temperature from −40 degrees Celsius to 120 degrees Celsius. Thus, the fourth voltage regulator circuit 500 may be configured to output an almost constant output current based on the change in the temperature, as shown in the sixth graph 600B.

Figure 7A:
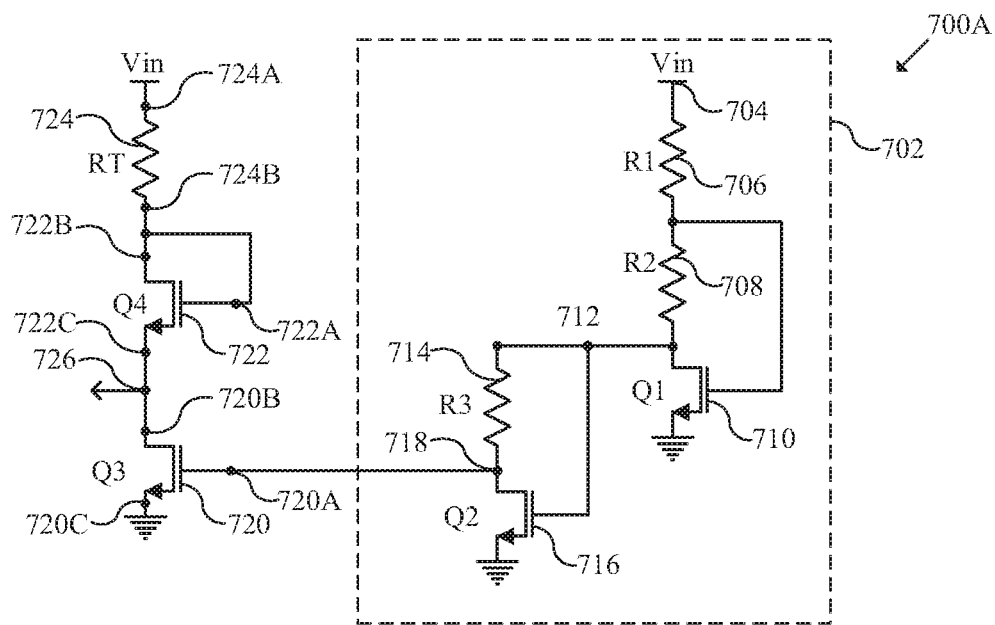
FIG. 7A is a schematic of an exemplary MOSFET-based voltage regulator circuit of FIG. 2A to provide a constant output voltage based on changes in temperature, in accordance with an embodiment of the disclosure.

FIG. 7A is a schematic of an exemplary MOSFET-based voltage regulator circuit of FIG. 2A to provide a constant output voltage based on changes in temperature, in accordance with an embodiment of the disclosure. FIG. 7A is described in conjunction with elements from FIGS. 1A, 2A, 3 and 5. With reference to FIG. 7A, there is shown a fifth voltage regulator circuit 700A which includes the second voltage regulator circuit 702 which may correspond to the voltage regulator circuit 302 of FIG. 3 or the second voltage regulator circuit 220 of FIG. 2A. The second voltage regulator circuit 702 may include an input terminal 704, a first resistor 706 (also represented as "R1"), a second resistor 708 (also represented as "R2"), a first MOSFET 710 (also represented as "Q1"), a first output terminal 712, a third resistor 714 (also represented as "R3"), a second MOSFET 716 (also represented as "Q2"), and a second output terminal 718 similar to FIGS. 2A, 3 and 5. The connections and operations of the second voltage regulator circuit 702 may be same as the second voltage regulator circuit 220, as described in FIG. 2A.

With reference to FIG. 7A, there is further shown, a third MOSFET 720 (also represented as "Q3"), a fourth MOSFET 722 (also represented as "Q4"), a fourth resistor 724 (also represented "RT"), and a third output terminal 726. The third MOSFET 720 and the fourth MOSFET 722 may be N-type MOSFET. The second output terminal 718 of the second voltage regulator circuit 702 may be connected to a gate terminal 720A of the third MOSFET 720. A source terminal 720C of the third MOSFET 720 may be coupled to ground (i.e. grounded). A first terminal 724A of the fourth resistor 724 may be configured to receive the input supply voltage supply Vin. A gate terminal 722A of the fourth MOSFET 722 may be connected with a second terminal 724B of the fourth resistor 724. The fourth MOSFET 722 may be configured to provide a negative feedback. The third output terminal 726 may be connected to a source terminal 722C of the fourth MOSFET 722 and a drain terminal 720B of the third MOSFET 720.

The fifth voltage regulator circuit 700A may be configured to receive the input supply voltage Vin at the input terminal 704 and provide the constant second output voltage at the second output terminal 718, based on operations of the first MOSFET 710 and the second MOSFET 716 as described in FIG. 2A. The fifth voltage regulator circuit 700A may be further configured to provide a third constant output voltage at the third output terminal 726 in response to change in the temperature around the fifth voltage regulator circuit 700A and a resistance value of the fourth resistor 724.

Figure 7B:
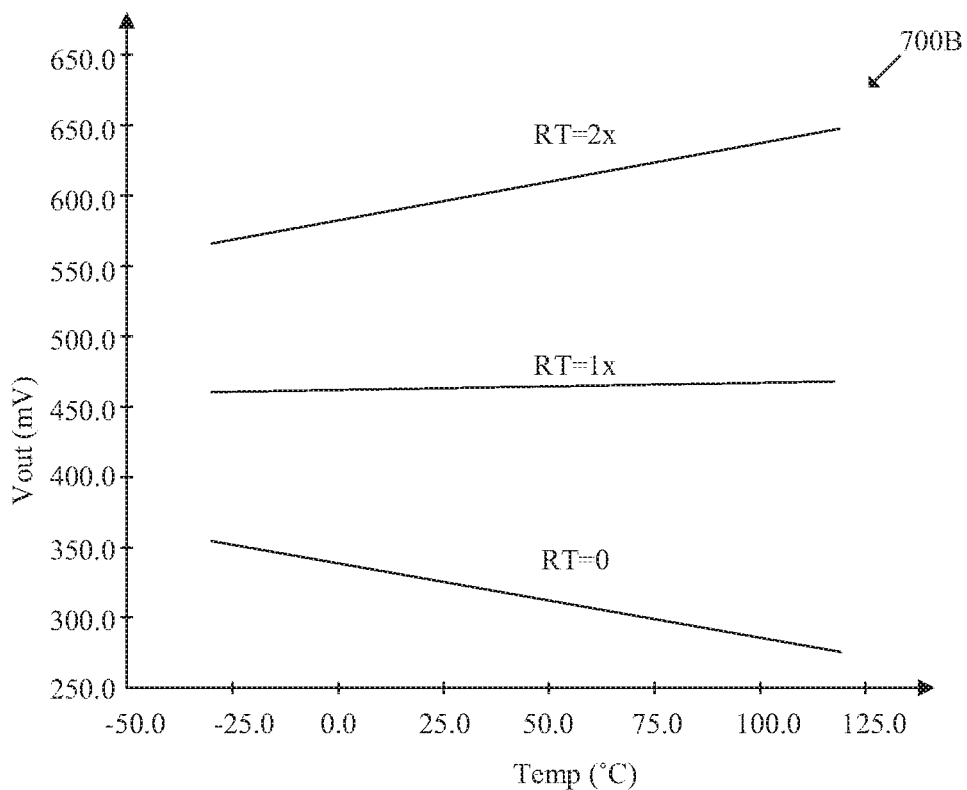
FIG. 7B is a graph that illustrates changes in an output voltage based on changes in temperature of the MOSFET-based voltage regulator circuit of FIG. 7A, in accordance with an embodiment of the disclosure.

FIG. 7B is a graph that illustrates changes in an output voltage based on changes in temperature of the MOSFET-based voltage regulator circuit of FIG. 7A, in accordance with an embodiment of the disclosure. FIG. 7B is explained in conjunction with elements from FIG. 7A. With reference to FIG. 7B, there is shown a seventh graph 700B. The seventh graph 700B indicates a temperature (in degree Celsius at X-axis) and an output Voltage (in mV at Y-axis) of the fifth voltage regulator circuit 700A of FIG. 7A. The temperature and the output voltage values depicted at FIG. 7B may be an exemplary experimental or simulation data determined from the fifth voltage regulator circuit 700A and may not be construed as limiting the present disclosure.

From the seventh graph 700B, it may be observed that in case the resistance value of RT=0, then the output voltage decreases as the temperature increases. Furthermore, it may be observed that in case the resistance value of RT is a defined value (i.e. RT=1 x), then the output voltage may be constant as the fifth voltage regulator circuit 700A may provide a constant output voltage at the third output terminal 726 based on the change in the temperature around the fifth voltage regulator circuit 700A. Furthermore, as per FIG. 7B, it may be observed, that in case the resistance value of RT is twice than the defined value (i.e. RT=2×), then the output voltage may increase based on the change in the temperature around the fifth voltage regulator circuit 700A.

Figure 8A:
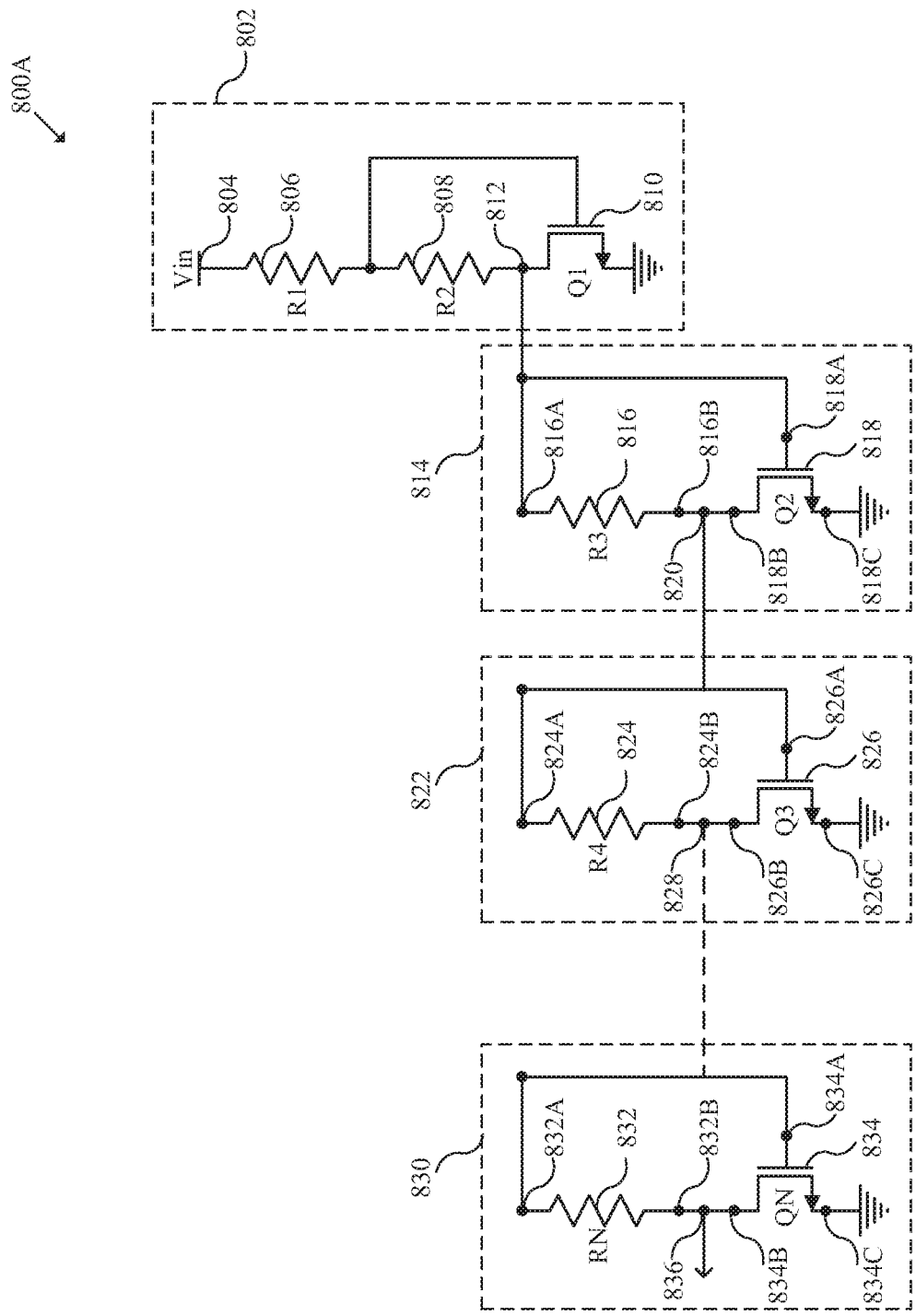
FIG. 8A is a schematic diagram of an exemplary MOSFET-based voltage regulator circuit that includes a plurality of cascaded stages, in accordance with an embodiment of the disclosure.

FIG. 8A is a schematic diagram of an exemplary MOSFET-based voltage regulator circuit that includes a plurality of cascaded stages, in accordance with an embodiment of the disclosure. FIG. 8A is described in conjunction with elements from FIGS. 1A, 2A, 3 and 5. With reference to FIG. 8A, there is shown a sixth voltage regulator circuit 800A which includes the voltage regulator circuit 802 which is similar to the voltage regulator circuit 102 of FIG. 1. The voltage regulator circuit 802 may be configured to receive the input supply voltage Vin at the input terminal 804 and output the first constant output voltage based on the change in the input supply voltage Vin as described in FIG. 1. The voltage regulator circuit 802 may achieve a variation of 1 mV as the output voltage with the change of 300 mV in the input supply voltage Vin as described in FIG. 1A.

As per FIG. 8A, the first output terminal 812 of the voltage regulator circuit 802 may be further connected to a first circuit 814. The first circuit 814 may include a third resistor 816 (also represented as "R3"), a second MOSFET 818 (also represented as "Q2"), and a second output terminal 820. A first terminal 816A of the third resistor 816 may be connected with the first output terminal 812. A gate terminal 818A of the second MOSFET 818 may be connected with the first output terminal 812 and the first terminal 816A of the third resistor 816. The voltage regulator circuit 802 connected with the first circuit 814 may be configured to output a second constant output voltage at the second output terminal 820, based on a change in the input supply voltage Vin. The combination of the voltage regulator circuit 802 and the first circuit 814 is similar to the second voltage regulator circuit 220 described in FIG. 2A. The combination may provide a second constant output voltage at the second output terminal 820. The second constant output voltage may vary by 1 mV based on the change in the input supply voltage at a range of 600 mV as described in FIG. 2B. Thus, the second constant output voltage may be an additional regulated voltage as compared to the first constant output voltage provided by the voltage regulator circuit 802.

In accordance with an embodiment, the second output terminal 820 of the first circuit 814 may be further connected to a second circuit 822. The second circuit 822 may include a fourth resistor 824 (also represented as "R4"), a third MOSFET 826 (also represented as "Q3"), and a third output terminal 828. A first terminal 824A of the fourth resistor 824 (also represented as "R4") may be connected with the second output terminal 820. A gate terminal 826A of the third MOSFET 826 may be connected with the second output terminal 820 and the first terminal 824A of the fourth resistor 824. As shown in FIG. 8A, the first circuit 814 is similar to the second circuit 822 both in terms of the connection and functionalities. The second circuit 822 may be configured to output a third constant output voltage at the third output terminal 828, based on a change in the input supply voltage Vin. The second circuit 822 may be utilized to achieve additional voltage regulation as compared to voltage regulation provided by the voltage regulator circuit 802 connected with the first circuit 814. For example, the voltage regulation provided by the second circuit 822 cascaded with the first circuit 814 and the voltage regulator circuit 802 may be twice as provided by the combination of the first circuit 814 and the voltage regulator circuit 802.

In accordance with an embodiment, the second circuit 822 may be further cascaded with similar regulation circuits or stages as shown in FIG. 8A. With each stage, the sixth voltage regulator circuit 800A may increase the output voltage regulation based on the change in the input supply voltage over a particular range. For example, the Nth circuit shown in FIG. 8A may provide constant output voltage for $2^N$ times volts variation in the input supply voltage Vin as compared to the first constant output voltage provided by the voltage regulator circuit 802. Thus, the greater the number of MOSFET-based voltage regulator circuit, the better the voltage regulation or generation of the constant voltage reference for wider range of variation in the input supply voltage and the temperature.

Figure 8B:
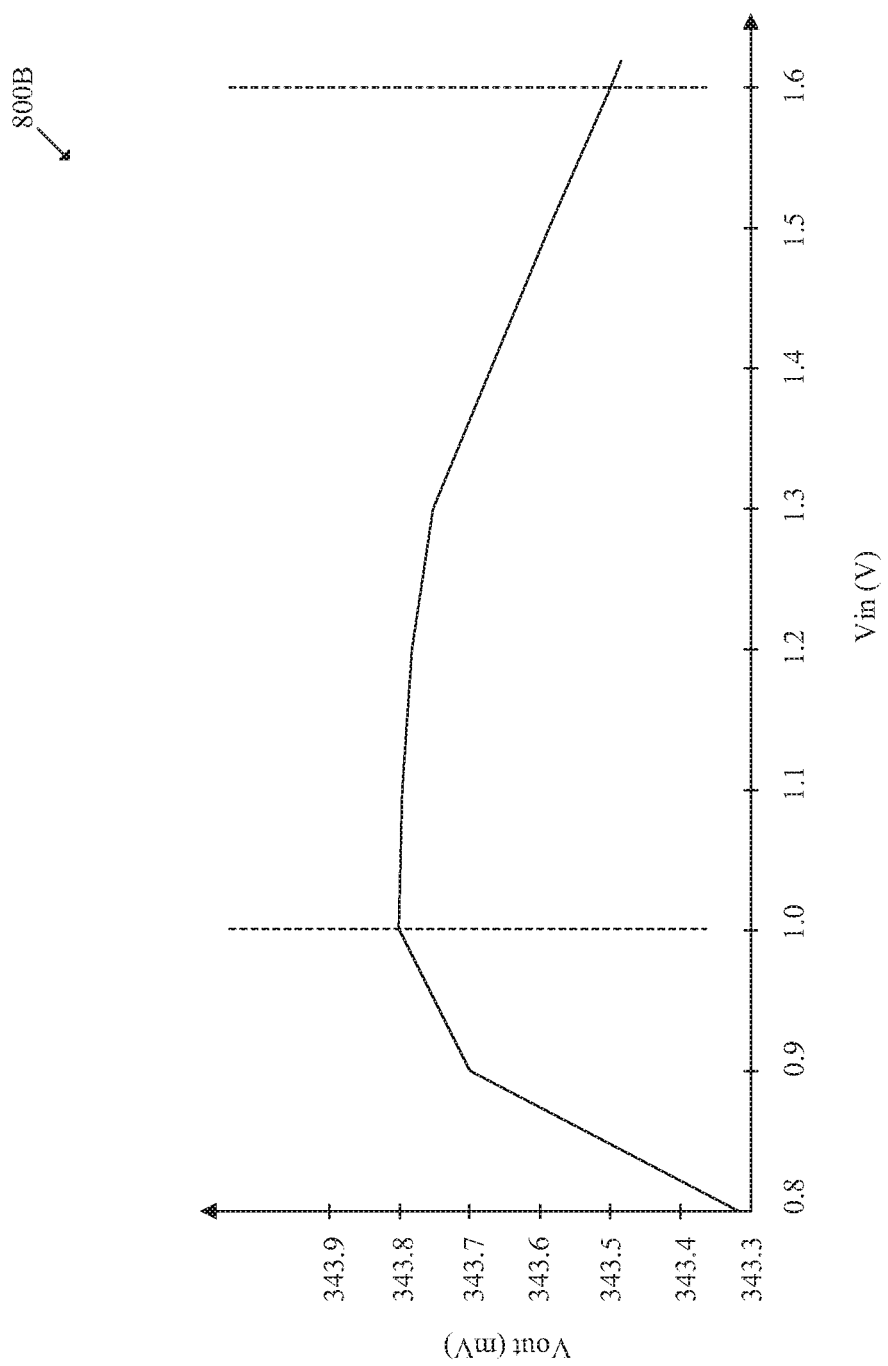
FIG. 8B is a graph that illustrates changes in an output voltage based on changes in an input supply voltage of the MOSFET-based voltage regulator circuit of FIG. 8A, in accordance with an embodiment of the disclosure.

FIG. 8B is a graph that illustrates changes in an output voltage based on changes in an input supply voltage of the MOSFET-based voltage regulator circuit of FIG. 8A, in accordance with an embodiment of the disclosure. FIG. 8B is explained in conjunction with elements from FIG. 8A. With reference to FIG. 8B, there is shown an eighth graph 800B. The eighth graph 800B indicates an input supply voltage (also represented as Vin in volts at X-axis) and an output voltage (in mV at Y-axis) of the second circuit 822 of FIG. 8A. The output voltage may be output at the third output terminal 828. The input supply voltage Vin and the output voltage values depicted at FIG. 8B, may be an exemplary experimental or simulation data determined from the second circuit 822 and may not be construed as limiting the present disclosure.

From the eighth graph 800B, it may be observed that when the input supply voltage Vin (i.e. supplied at the input terminal 804) increases from 0.8 V to 1.0 V, the output voltage of the second circuit 822 increases from 343.3 mV to 343.8 mV, for example. Furthermore, it may be observed, that as the input supply voltage Vin increases from the 1.0 V to 1.6 V, the second circuit 822 may provide an almost constant output voltage (as the third constant output voltage) which lies between 343.8 mV to 343.5 mV. In other words, for a change of 600 mV in the input supply voltage Vin, the change in the output voltage of the second circuit 822 is 0.30 mV. Hence, the voltage regulator circuit 802 cascaded with the first circuit 814 and the second circuit 822 may be configured to output an almost constant output voltage based on the change in the input supply voltage Vin in particular range, as shown in the eighth graph 800B. As shown in FIGS. 1B, 2B and 8B, as the number of MOSFETS circuits cascaded with the voltage regulator circuit 102 of FIG. 1 (or the voltage regulator circuit 802 of FIG. 8A) increases, the change in the output voltage based on the change in the input supply voltage Vin decreases. Hence, an improved voltage regulation or voltage reference generation may be achieved as the number of MOSFET circuits cascaded with the voltage regulator circuit 102 of FIG. 1 increases.

Figure 9B:
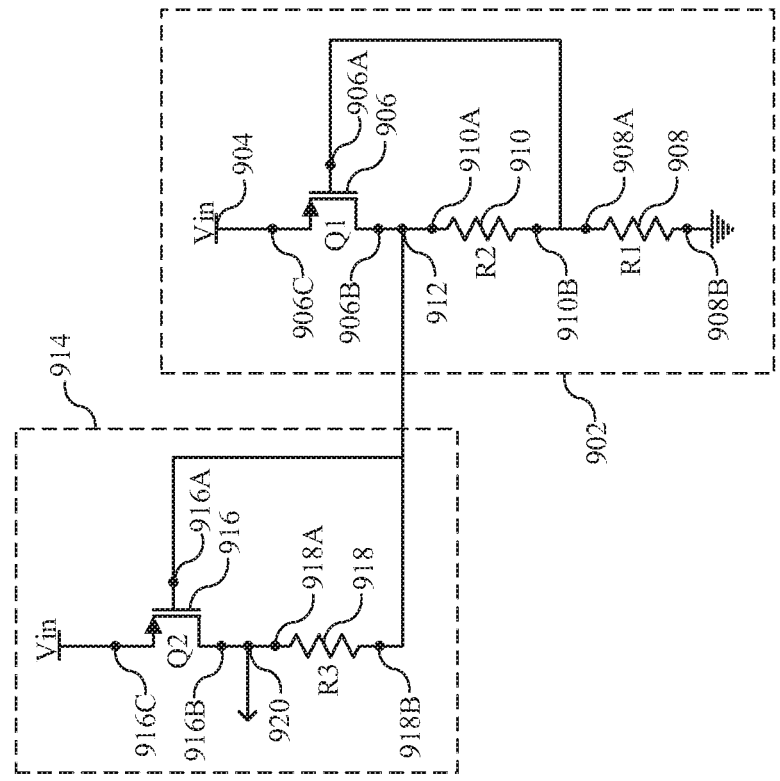
FIGS. 9A, 9B, 9C and 9D are exemplary schematic diagrams of P-type MOSFET-based voltage regulator circuits, in accordance with an embodiment of the disclosure.
Figure 9A:
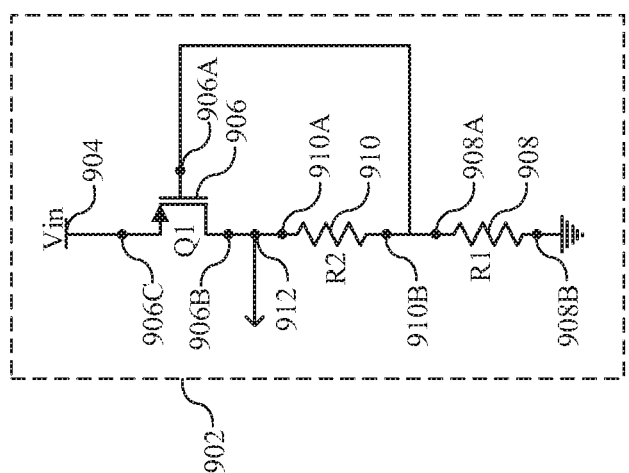

FIGS. 9A, 9B, 9C and 9D are exemplary schematic diagrams of P-type MOSFET-based voltage regulator circuits, in accordance with an embodiment of the disclosure. With reference to FIG. 9A, there is shown a voltage regulator circuit 902. The voltage regulator circuit 902 may include an input terminal 904, a first MOSFET 906 (also represented as "Q1"), a first resistor 908 (also represented as "R1"), a second resistor 910 (also represented as "R2"), and a first output terminal 912.

In accordance with an embodiment, the first MOSFET 906 may be P-type MOSFET (or PMOS). A first source terminal 906C of the first MOSFET 906 may be connected with the input terminal 904 and may be configured to receive the input supply voltage Vin. A gate terminal 906A of the first MOSFET 906 may be connected with a first terminal 908A of the first resistor 908 and a second terminal 910B of the second resistor 910. The first output terminal 912 may be connected with a drain terminal 906B of the first MOSFET 906 and a first terminal 910A of the second resistor 910. A second terminal 908B of the first resistor 908 may be grounded. In accordance with an embodiment, a ratio of a resistance value of the first resistor 908 and a resistance value of the second resistor 910 may be defined. In an embodiment, the resistance value of the first resistor 908 and the resistance value of the second resistor 910 may be based on a number of MOSFETs used in the voltage regulator circuit 902, a channel length and a channel width of the MOSFET (for example first MOSFET 906). The voltage regulator circuit 902 may be configured to receive an input supply voltage Vin at the first source terminal 906C of the first MOSFET 906. The first MOSFET 906 may be further configured to operate in pull-up configuration and may provide a first constant output voltage or regulated output voltage at the first output terminal 912 based on a change in the input supply voltage Vin as described in detail for N-type MOSFET voltage regulator circuit in FIG. 1A.

With reference to FIG. 9B, there is shown the voltage regulator circuit 902 connected with a first circuit 914. The first circuit 914 may include a second MOSFET 916 (also represented as "Q2"), a third resistor 918, and a second output terminal 920. The second MOSFET 916 may be P-type MOSFET. A source terminal 916C of the second MOSFET 916 may be configured to receive the input supply voltage Vin. A gate terminal 916A of the second MOSFET 916 may be connected with the first output terminal 912 of the voltage regulator circuit 902 and a second terminal 918B of the third resistor 918. The second output terminal 920 may be connected with a drain terminal 916B of the second MOSFET 916 and a first terminal 918A of the third resistor 918. The second MOSFET 916 may be configured to receive, at the gate terminal 916A, the first constant output voltage from the first output terminal 912. In accordance with an embodiment, the second MOSFET 916 may be further configured to operate in pull-up configuration and may provide a second constant output voltage at the second output terminal 920 based on the change in the input supply voltage Vin. The voltage regulator circuit 902 may be cascaded with the first circuit 914 to achieve an additional voltage regulation, over the change in the input supply voltage Vin, as compared to the first constant output voltage provided by the voltage regulator circuit 902 as described in detail for N-type MOSFET-based second voltage regulator circuit 220 in FIG. 2A.

Figure 9C:
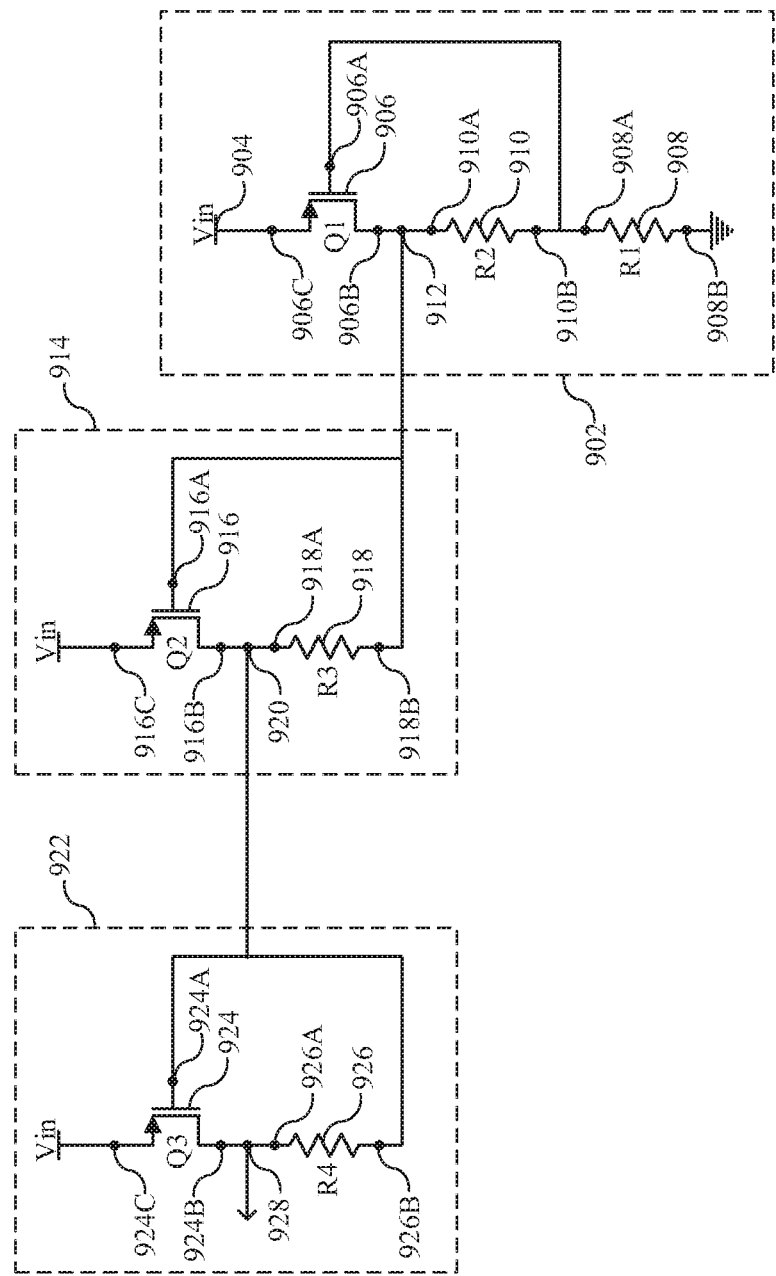

With reference to FIG. 9C, there is shown the voltage regulator circuit 902 cascaded with the first circuit 914 and a second circuit 922. The second circuit 922 may include a third MOSFET 924 (also represented as "Q3"), a fourth resistor 926 (also represented as "R4"), and a third output terminal 928. The third MOSFET 924 may be P-type MOSFET. A source terminal 924C of the third MOSFET 924 may be configured to receive the input supply voltage Vin. A gate terminal 924A of the third MOSFET 924 may be connected with the second output terminal 920 of the first circuit 914 and a second terminal 926B of the fourth resistor 926. The third output terminal 928 may be connected with a drain terminal 924B of the third MOSFET 924 and a first terminal 926A of the fourth resistor 926. The third MOSFET 924 may be configured to receive the second constant output voltage from the second output terminal 920, operate in the pull-up configuration, and provide a third constant output voltage at the third output terminal 928 based on the change in the input supply voltage Vin. The voltage regulator circuit 902 may be cascaded with the first circuit 914 and the second circuit 922 to achieve an additional voltage regulation, over the change in the input supply voltage as compared to the output voltage provided by the combination of the voltage regulator circuit 902 cascaded with the first circuit 914.

Figure 9D:
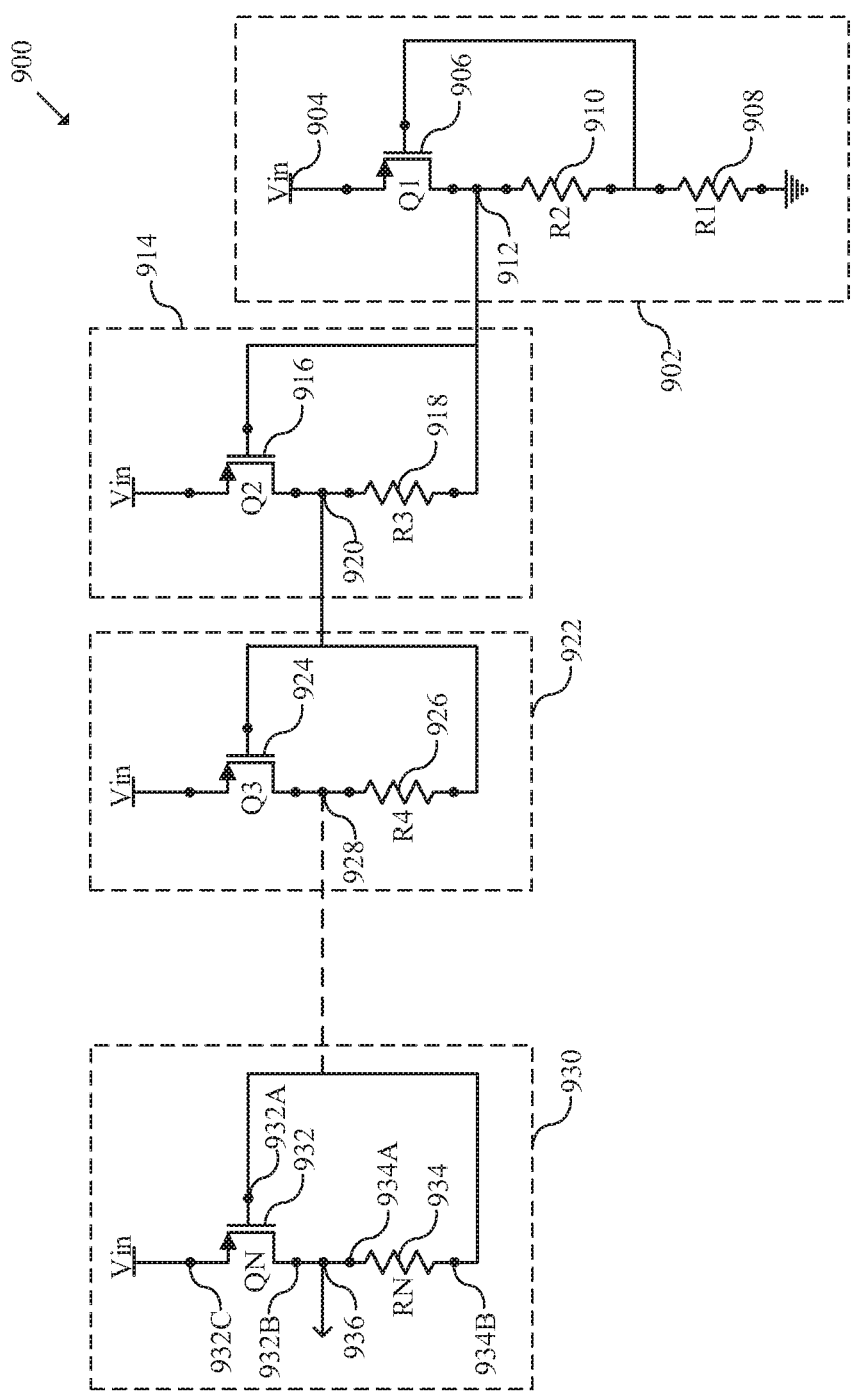

With reference to FIG. 9D, there is shown the voltage regulator circuit 900 where multiple P-type MOSFET-based voltage regulator circuits are cascaded similar to N-type MOSFET-based cascaded voltage regulator circuits described in FIG. 8A. The voltage regulation of the output voltage increases with the change in the input supply voltage Vin at each stage of the cascaded voltage regulator circuit shown in FIG. 9D.

Figure 10:
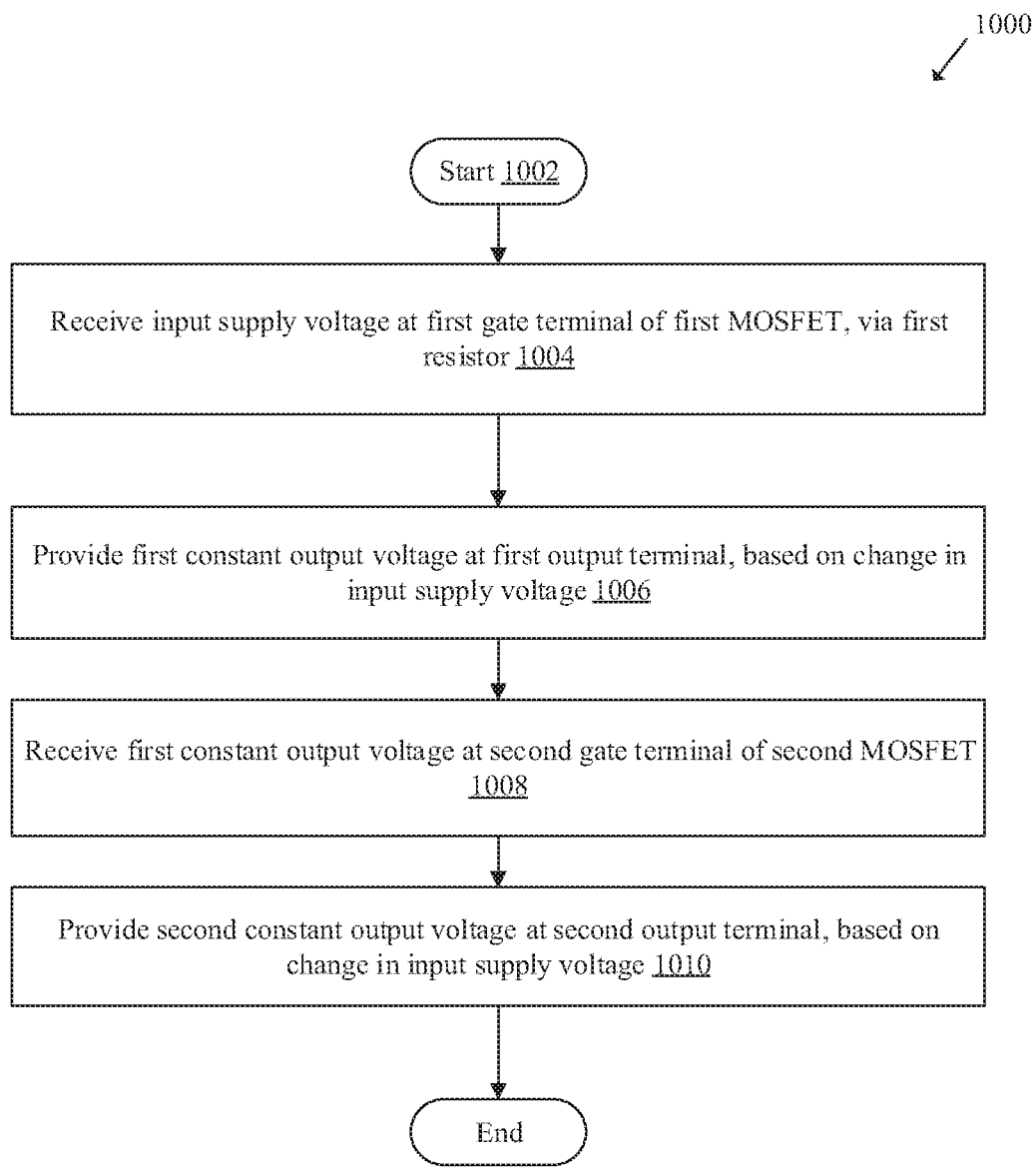
FIG. 10 is a flowchart that illustrates exemplary operations of MOSFET-based voltage regulator circuit, in accordance with an embodiment of the disclosure.

FIG. 10 is a flowchart that illustrates exemplary operations of MOSFET-based voltage regulator circuit, in accordance with an embodiment of the disclosure. FIG. 10 is described in conjunction with elements from FIGS. 1A, 1B, 2A, 2B, 2C, 3, 4A, 4B, 5, 6A, 6B, 7A, 7B, 8A, 8B, 9A, 9B, 9C, and 9D. With reference to FIG. 10, there is shown a flowchart 1000. The operations of the flowchart may be executed by the voltage regulator circuit 102. The operations may start at 1002 and proceed to 1004.

At 1004, the input supply voltage Vin may be received at the first gate terminal 110A of the first MOSFET 110, via the first resistor 106. The first MOSFET 110 may be configured to receive the input supply voltage Vin at the first gate terminal 110A of the first MOSFET 110. The first MOSFET 110 may be N-type MOSFET. The connections of the voltage regulator circuit 102 are shown and described, for example, in FIG. 1A.

At 1006, a first constant output voltage may be provided at the first output terminal 112, based on a change in the input supply voltage Vin. The first MOSFET 110 may be configured to provide the first constant output voltage at the first output terminal 112. The operations of the first MOSFET 110 to provide the first constant output voltage are described, for example, in FIGS. 1A and 1B.

At 1008, the first constant output voltage may be received at the second gate terminal 216A of the second MOSFET 216. The second MOSFET 216 may be configured to receive the first constant output voltage at the second gate terminal 216A of the second MOSFET 216. The second MOSFET 216 may be N-type MOSFET. The voltage regulator circuit 102 that includes the second MOSFET 216 may correspond to the second voltage regulator circuit 220 of FIG. 2A. The connections and operations of the second voltage regulator circuit 220 are shown and described for example, in FIG. 2A.

At 1010, a second constant output voltage may be provided at the second output terminal 218, based on a change in the input supply voltage Vin. The second MOSFET 216 may be configured to provide the second constant output voltage at the second output terminal 218. The operations of the second MOSFET 216 to provide the second constant output voltage are described, for example, in FIGS. 2A and 2B. The voltage regulation achieved with the use of two MOSFETs may be improved voltage regulation as compared to the voltage regulation achieved with the use of a single MOSFET. The control may pass to end.

Exemplary aspects of the disclosure may include the voltage regulator circuit 102 that includes the first resistor 106 (also represented as "R1"), the second resistor 108 (also represented as "R2"), and the first metal oxide semiconductor field effect transistor (MOSFET) 110 (also represented as "Q1"). A first gate terminal of the first MOSFET 110 may be connected to a second terminal of the first resistor 106 and a first terminal of the second resistor 108. A first drain terminal of the first MOSFET 110 may be connected to a second terminal of the second resistor 108 and the first output terminal 112 of the voltage regulator circuit 102. The first MOSFET 110 may be configured to receive an input supply voltage at the first gate terminal of the first MOSFET 110, via the first resistor 106. The first MOSFET 110 may be further configured to provide a first constant output voltage at the first output terminal 112 based on a change in the input supply voltage.

In accordance with an embodiment, the first MOSFET 110 may be N-type MOSFET. The first MOSFET 110 may be further configured to provide a negative feedback. A ratio of a resistance value of the first resistor 106 and a resistance value of the second resistor 108 may be defined. The first MOSFET 110 may be further configured to receive the input supply voltage at the first gate terminal based on the defined ratio. In accordance with an embodiment, the voltage regulator circuit 102 may further include the second MOSFET 216 (also represented as "Q2") and the third resistor 214 (also represented as "R3"). A second gate terminal of the second MOSFET 216 may be connected to the first output terminal of the first MOSFET 110 and a first terminal of the third resistor 214. A second drain terminal of the second MOSFET 216 may be connected to a second terminal of the third resistor 214 and the second output terminal 218. A first source terminal of the first MOSFET 110 and a second source terminal of the second MOSFET 216 may be grounded. The second MOSFET 216 may be N-type MOSFET. The second MOSFET 216 may be configured to receive the first constant output voltage at the second gate terminal of the second MOSFET 216. The second MOSFET 216 may be further configured to provide a second constant output voltage at the second output terminal 218 based on a change in the input supply voltage. The voltage regulator circuit 102 may further include a fourth resistor 222 connected between the first output terminal 212 and the first terminal of the third resistor 214.

In accordance with an embodiment, the voltage regulator circuit 102 may further include an operational amplifier, such as the operational amplifier 320, the third MOSFET 322 (also represented as "Q3"), the fourth MOSFET 324 (also represented as "Q4"), and a fifth resistor (such as the fourth resistor 326 in FIG. 3). A negative input terminal of the operational amplifier 320 may be connected to the second output terminal of the voltage regulator circuit 102. An output terminal of the operational amplifier 320 may be connected to a fourth gate terminal of the fourth MOSFET 324. A positive input terminal of the operational amplifier 320 may be connected to a third output terminal of the voltage regulator circuit 102, a fourth drain terminal of the fourth MOSFET 324 and a first terminal of the fifth resistor. The third MOSFET 322 may be N-type MOSFET and the fourth MOSFET 324 may be P-type MOSFET configured to receive the input supply voltage at a fourth source terminal of the fourth MOSFET 324. A third gate terminal of the third MOSFET 322 may be connected to a second terminal of the fifth resistor and a third drain terminal of the third MOSFET 322. A third source terminal of the third MOSFET 322 may be grounded.

The operational amplifier 320 may be configured to compare a second constant output voltage at the second output terminal and a voltage reference at the third output terminal of the voltage regulator circuit 102. The operational amplifier 320 may be further configured to control generation of the voltage reference at the third output terminal of the voltage regulator circuit 102 based on the comparison. The generated voltage reference may be constant based on a change in the input supply voltage. The generated voltage reference may be constant based on a change in temperature around the voltage regulator circuit 102. In accordance with an embodiment, the third MOSFET 322 and the fifth resistor may be connected in parallel. A third gate terminal of the third MOSFET 322 may be connected to the third output terminal of the voltage regulator circuit and the first terminal of the fifth resistor. The parallel connection between third MOSFET 322 and the fifth resistor may be configured to provide constant output current based on a change in the input supply voltage and temperature around the voltage regulator circuit 102.

The present disclosure may be realized in hardware, or a combination of hardware and software. The present disclosure may be realized in a centralized fashion, in at least one computer system, or in a distributed fashion, where different elements may be spread across several interconnected computer systems. A computer system or other apparatus adapted for carrying out the methods described herein may be suited. A combination of hardware and software may be a general-purpose computer system with a computer program that, when loaded and executed, may control the computer system such that it carries out the methods described herein. The present disclosure may be realized in hardware that comprises a portion of an integrated circuit that also performs other functions.

The present disclosure may also be embedded in a computer program product, which comprises all the features enabling the implementation of the methods described herein, and which when loaded in a computer system is able to carry out these methods. Computer program, in the present context, means any expression, in any language, code or notation, of a set of instructions intended to cause a system having an information processing capability to perform a particular function either directly, or after either or both of the following: a) conversion to another language, code or notation; b) reproduction in a different material form.

While the present disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

What is claimed is:
1. A voltage regulator circuit, comprising:
a first resistor;
a second resistor; and
a first Metal oxide semiconductor field effect transistor (MOSFET),
wherein a first gate terminal of the first MOSFET is connected to a second terminal of the first resistor and a first terminal of the second resistor,
wherein a first drain terminal of the first MOSFET is connected to a second terminal of the second resistor and a first output terminal of the voltage regulator circuit, and
wherein the first MOSFET is configured to:
receive an input supply voltage at the first gate terminal of the first MOSFET via the first resistor, and
provide a first constant output voltage at the first output terminal based on a change in the input supply voltage.
2. The voltage regulator circuit according to claim 1, wherein the first MOSFET is N-type MOSFET, and
the first MOSFET is further configured to provide a negative feedback.

3. The voltage regulator circuit according to claim 1, wherein
a ratio of a resistance value of the first resistor and a resistance value of the second resistor is defined, and
the first MOSFET is further configured to receive the input supply voltage at the first gate terminal based on the defined ratio.

4. The voltage regulator circuit according to claim 1, further comprising:
a second MOSFET; and
a third resistor, wherein
a second gate terminal of the second MOSFET is connected to the first output terminal of the first MOSFET and a first terminal of the third resistor, and
a second drain terminal of the second MOSFET is connected to a second terminal of the third resistor and a second output terminal of the voltage regulator circuit.

5. The voltage regulator circuit according to claim 4, wherein a first source terminal of the first MOSFET and a second source terminal of the second MOSFET is grounded.

6. The voltage regulator circuit according to claim 4, wherein the second MOSFET is N-type MOSFET and is configured to:
receive the first constant output voltage at the second gate terminal of the second MOSFET; and
provide a second constant output voltage at the second output terminal based on the change in the input supply voltage.

7. The voltage regulator circuit according to claim 4, further comprising a fourth resistor connected between the first output terminal and the first terminal of the third resistor.

8. The voltage regulator circuit according to claim 4, further comprising:
an operational amplifier;
a third MOSFET;
a fourth MOSFET; and
a fifth resistor, wherein
a negative input terminal of the operational amplifier is connected to the second output terminal of the voltage regulator circuit,
an output terminal of the operational amplifier is connected to a fourth gate terminal of the fourth MOSFET, and
a positive input terminal of the operational amplifier is connected to a third output terminal of the voltage regulator circuit, a fourth drain terminal of the fourth MOSFET and a first terminal of the fifth resistor.

9. The voltage regulator circuit according to claim 8, wherein the third MOSFET is N-type MOSFET and the fourth MOSFET is P-type MOSFET configured to receive the input supply voltage at a fourth source terminal of the fourth MOSFET.

10. The voltage regulator circuit according to claim 8, wherein
a third gate terminal of the third MOSFET is connected to a second terminal of the fifth resistor and a third drain terminal of the third MOSFET, and
a third source terminal of the third MOSFET is grounded.

11. The voltage regulator circuit according to claim 10, wherein the operational amplifier is configured to:

compare a second constant output voltage at the second output terminal and a voltage reference at the third output terminal of the voltage regulator circuit; and
control generation of the voltage reference at the third output terminal of the voltage regulator circuit based on the comparison, wherein the generated voltage reference is constant based on the change in the input supply voltage.

12. The voltage regulator circuit according to claim 11, wherein the generated voltage reference is constant based on the change in temperature around the voltage regulator circuit.

13. The voltage regulator circuit according to claim 8, wherein the third MOSFET and the fifth resistor are connected in parallel, and wherein a third gate terminal of the third MOSFET is connected to the third output terminal of the voltage regulator circuit and the first terminal of the fifth resistor.

14. The voltage regulator circuit according to claim 13, wherein the parallel connection between the third MOSFET and the fifth resistor is configured to provide constant output current based on the change in the input supply voltage and a change in temperature around the voltage regulator circuit.

15. A voltage regulator circuit, comprising:
a first resistor;
a second resistor; and
a first Metal oxide semiconductor field effect transistor (MOSFET), wherein
a first gate terminal of the first MOSFET is connected to a first terminal of the first resistor and a second terminal of the second resistor,
a first drain terminal of the first MOSFET is connected to a first terminal of the second resistor and a first output terminal of the voltage regulator circuit, and
the first MOSFET is configured to:
receive an input supply voltage at a first source terminal of the first MOSFET, and
provide a first constant output voltage at the first output terminal based on a change in the input supply voltage.

16. The voltage regulator circuit according to claim 15, wherein the first MOSFET is P-type MOSFET and a second terminal of the first resistor is grounded.

17. The voltage regulator circuit according to claim 15, further comprising:
a second MOSFET; and
a third resistor, wherein
a second gate terminal of the second MOSFET is connected to the first output terminal of the first MOSFET and a second terminal of the third resistor, and
a second drain terminal of the second MOSFET is connected to a first terminal of the third resistor and a second output terminal of the voltage regulator circuit.

18. The voltage regulator circuit according to claim 17, wherein the second MOSFET is P-type MOSFET and is configured to:
receive the input supply voltage at a second source terminal of the second MOSFET; and
provide a second constant output voltage at the second output terminal based on the change in the input supply voltage.

19. A voltage reference generation circuit, comprising:
a voltage regulator circuit, which includes:
a first resistor,
a second resistor, and a first Metal oxide semiconductor field effect transistor (MOSFET), wherein
  a first gate terminal of the first MOSFET is connected to a second terminal of the first resistor and a first terminal of the second resistor, and
  a first drain terminal of the first MOSFET is connected to a second terminal of the second resistor and a first output terminal of the voltage regulator circuit, and
  the first MOSFET is configured to:
    receive an input supply voltage at the first gate terminal of the first MOSFET, via the first resistor; and
    provide a first constant output voltage at the first output terminal based on a change in the input supply voltage; and
an operational amplifier;
a second MOSFET;
a third MOSFET; and
a third resistor, wherein
  a negative input terminal of the operational amplifier is connected to the first output terminal of the voltage regulator circuit,
  an output terminal of the operational amplifier is connected to a third gate terminal of the third MOSFET, and
  a positive input terminal of the operational amplifier is connected to an output terminal of the voltage reference generation circuit, a third drain terminal of the third MOSFET and a first terminal of the third resistor.

20. The voltage reference generation circuit accordingly to claim 19, wherein the first MOSFET and the second MOSFET are N-type MOSFET, and wherein the third MOSFET is P-type MOSFET configured to receive the input supply voltage at a third source terminal of the third MOSFET.

21. The voltage reference generation circuit accordingly to claim 19, wherein
  a second gate terminal of the second MOSFET is connected to a second terminal of the third resistor and a second drain terminal of the second MOSFET, and
  a second source terminal of the second MOSFET is grounded.

22. The voltage reference generation circuit accordingly to claim 19, wherein the operational amplifier is configured to:
  compare a first constant output voltage at the first output terminal and a voltage reference at the output terminal of the voltage reference generation circuit; and
  control generation of the voltage reference at the output terminal of the voltage reference generation circuit based on the comparison, wherein the generated voltage reference is constant based on the change in the input supply voltage.

23. The voltage reference generation circuit according to claim 22, wherein the generated voltage reference is constant based on a change in temperature around the voltage reference generation circuit.

* * * * *